(12) United States Patent
Zhang et al.

(10) Patent No.: US 11,749,691 B2
(45) Date of Patent: *Sep. 5, 2023

(54) ELECTRONIC DEVICE SUBSTRATE, MANUFACTURING METHOD THEREOF, AND ELECTRONIC DEVICE

(71) Applicant: BOE Technology Group Co., Ltd., Beijing (CN)

(72) Inventors: Kui Zhang, Beijing (CN); Pengcheng Lu, Beijing (CN); Li Liu, Beijing (CN); Yunlong Li, Beijing (CN); Dacheng Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/847,877

(22) Filed: Jun. 23, 2022

(65) Prior Publication Data

US 2022/0336503 A1    Oct. 20, 2022

Related U.S. Application Data

(63) Continuation of application No. 16/959,398, filed as application No. PCT/CN2019/102819 on Aug. 27, 2019, now Pat. No. 11,404,451.

(51) Int. Cl.
*H01L 27/12* (2006.01)

(52) U.S. Cl.
CPC ...... *H01L 27/1244* (2013.01); *H01L 27/1259* (2013.01)

(58) Field of Classification Search
None
See application file for complete search history.

(56) References Cited

U.S. PATENT DOCUMENTS

| 5,898,322 A | 4/1999 | Kubota et al. |
| 5,960,268 A | 9/1999 | Aihara |

(Continued)

FOREIGN PATENT DOCUMENTS

| CN | 1530878 A | 9/2004 |
| CN | 101833186 A | 9/2010 |

(Continued)

OTHER PUBLICATIONS

Jan. 18, 2017—International Search Report Appn PCT/CN2016/101999.

(Continued)

*Primary Examiner* — Bo B Jang
(74) *Attorney, Agent, or Firm* — Banner & Witcoff, Ltd.

(57) ABSTRACT

An electronic device substrate, a manufacturing method thereof, and an electronic device are provided. The electronic device substrate includes a base substrate, a first insulating layer, and light-emitting sub-units, a first conductive member and a second conductive member, which are on a side of the first insulating layer away from the base substrate. The light-emitting sub-units and the first conductive member are respectively in array region and periphery region, and the second conductive member is between the first conductive member and the array region; orthogonal projections of the first and second conductive members on the base substrate are spaced apart; each light-emitting sub-unit includes first and second driving electrodes, second driving electrodes of the light-emitting sub-units are integrated to form a first common electrode layer; the periphery region further includes a second common electrode layer electrically connected to the first conductive member and the first common electrode layer.

19 Claims, 8 Drawing Sheets

(56) References Cited

U.S. PATENT DOCUMENTS

| | | | |
|---|---|---|---|
| 6,040,208 | A | 3/2000 | Honeycutt et al. |
| 6,274,421 | B1 | 8/2001 | Hsu et al. |
| 6,580,094 | B1 | 6/2003 | Yamazaki et al. |
| 7,361,534 | B2 | 4/2008 | Pelella |
| 7,432,146 | B2 | 10/2008 | Yamamoto |
| 7,838,883 | B2 | 11/2010 | Yamazaki et al. |
| 8,017,945 | B2 | 9/2011 | Yamazaki et al. |
| 8,772,766 | B2 | 7/2014 | Yamazaki et al. |
| 9,023,678 | B2 | 5/2015 | Heo et al. |
| 9,236,408 | B2 | 1/2016 | Yamazaki |
| 9,401,112 | B2 | 7/2016 | Ohara et al. |
| 9,711,549 | B2 | 7/2017 | Yamazaki et al. |
| 9,721,509 | B2 | 8/2017 | Kim et al. |
| 9,748,292 | B2 | 8/2017 | Yamazaki |
| 9,859,439 | B2 | 1/2018 | Miyairi |
| 9,875,690 | B2 | 1/2018 | Wang et al. |
| 10,050,062 | B2 | 8/2018 | Sasagawa et al. |
| 10,147,747 | B2 | 12/2018 | Toriumi et al. |
| 10,796,641 | B2 | 10/2020 | Yang et al. |
| 11,037,529 | B2 | 6/2021 | Wang |
| 11,322,082 | B2 | 5/2022 | Hu et al. |
| 2002/0084463 | A1 | 7/2002 | Sanford et al. |
| 2002/0179908 | A1 | 12/2002 | Arao |
| 2003/0025659 | A1 | 2/2003 | Kondo et al. |
| 2003/0030144 | A1 | 2/2003 | Ono et al. |
| 2003/0153155 | A1 | 8/2003 | Wang et al. |
| 2005/0173761 | A1 | 8/2005 | Takafuji et al. |
| 2005/0245046 | A1 | 11/2005 | Takafuji et al. |
| 2006/0170634 | A1 | 8/2006 | Kwak et al. |
| 2006/0205166 | A1 | 9/2006 | Ishikiriyama |
| 2007/0164290 | A1 | 7/2007 | Yamazaki et al. |
| 2007/0295961 | A1 | 12/2007 | Kim |
| 2008/0169757 | A1 | 7/2008 | Chang et al. |
| 2008/0191603 | A1 | 8/2008 | Kubota |
| 2008/0210928 | A1 | 9/2008 | Abe et al. |
| 2009/0114926 | A1 | 5/2009 | Yamazaki |
| 2009/0152625 | A1 | 6/2009 | Lee et al. |
| 2010/0025664 | A1 | 2/2010 | Park |
| 2012/0105421 | A1 | 5/2012 | Tsai et al. |
| 2012/0235973 | A1 | 9/2012 | Yoo |
| 2013/0001601 | A1 | 1/2013 | Lee et al. |
| 2013/0328753 | A1 | 12/2013 | Tsuge |
| 2014/0034982 | A1 | 2/2014 | Yamazaki |
| 2014/0131717 | A1 | 5/2014 | Qi et al. |
| 2014/0312334 | A1 | 10/2014 | Yamazaki et al. |
| 2014/0361276 | A1 | 12/2014 | Hsu et al. |
| 2014/0367652 | A1 | 12/2014 | Cho et al. |
| 2015/0108470 | A1 | 4/2015 | Yamazaki et al. |
| 2015/0108475 | A1 | 4/2015 | Ando et al. |
| 2015/0270326 | A1 | 9/2015 | Hekmatshoartabar et al. |
| 2015/0348997 | A1 | 12/2015 | Sasagawa et al. |
| 2016/0172431 | A1 | 6/2016 | Huang et al. |
| 2016/0181350 | A1 | 6/2016 | Lee |
| 2016/0275870 | A1 | 9/2016 | Kimura et al. |
| 2016/0327842 | A1 | 11/2016 | Qiao et al. |
| 2016/0351589 | A1 | 12/2016 | Sasagawa et al. |
| 2017/0047004 | A1 | 2/2017 | Yoon et al. |
| 2017/0193879 | A1 | 7/2017 | Wang |
| 2017/0301293 | A1 | 10/2017 | Zhu et al. |
| 2018/0102092 | A1 | 4/2018 | Kubota et al. |
| 2018/0151827 | A1 | 5/2018 | Kang et al. |
| 2019/0251905 | A1 | 8/2019 | Yang et al. |
| 2019/0386074 | A1* | 12/2019 | Li ................... H01L 51/5221 |
| 2021/0233968 | A1 | 7/2021 | Yang et al. |

FOREIGN PATENT DOCUMENTS

| | | |
|---|---|---|
| CN | 101980330 A | 2/2011 |
| CN | 102760841 A | 10/2012 |
| CN | 102983155 A | 3/2013 |
| CN | 103022079 A | 4/2013 |
| CN | 203026507 U | 6/2013 |
| CN | 103403787 A | 11/2013 |
| CN | 103440840 A | 12/2013 |
| CN | 103515413 A | 1/2014 |
| CN | 104025707 A | 9/2014 |
| CN | 104201190 A | 12/2014 |
| CN | 104240633 A | 12/2014 |
| CN | 104299572 A | 1/2015 |
| CN | 104332561 A | 2/2015 |
| CN | 104380368 A | 2/2015 |
| CN | 104681624 A | 6/2015 |
| CN | 105185816 A | 12/2015 |
| CN | 105225633 A | 1/2016 |
| CN | 204966501 U | 1/2016 |
| CN | 105304679 A | 2/2016 |
| CN | 106159100 A | 11/2016 |
| CN | 205789046 U | 12/2016 |
| CN | 107086237 A | 8/2017 |
| CN | 107103878 A | 8/2017 |
| CN | 107424570 A | 12/2017 |
| CN | 107591125 A | 1/2018 |
| CN | 107768385 A | 3/2018 |
| CN | 107799577 A | 3/2018 |
| CN | 109036279 A | 12/2018 |
| CN | 109119027 A | 1/2019 |
| CN | 109215549 A | 1/2019 |
| CN | 109509430 A | 3/2019 |
| CN | 109904347 A | 6/2019 |
| CN | 110071229 A | 7/2019 |
| EP | 1096571 A2 | 5/2001 |
| JP | H06347828 A | 12/1994 |
| JP | 2000315734 A | 11/2000 |
| JP | 2001195016 A | 7/2001 |
| JP | 2001332383 A | 11/2001 |
| JP | 2007156058 A | 6/2007 |
| JP | 2008153191 A | 7/2008 |
| JP | 2009003435 A | 1/2009 |
| JP | 2009016410 A | 1/2009 |
| JP | 2009036948 A | 2/2009 |
| JP | 2011181938 A | 9/2011 |
| KR | 20080101732 A | 11/2008 |
| KR | 101645404 B1 | 8/2016 |
| KR | 20170005252 A | 1/2017 |

OTHER PUBLICATIONS

Apr. 17, 2018—International Preliminary Report on Patentability Appn PCT/CN2016/101999.

May 27, 2020—International Search Report International Appn PCT/CN2019/102314 with English Translation.

Apr. 26, 2020—International Search Report International Appn PCT/CN2019/102293 with English Translation.

May 26, 2020—International Search Report of the International Appn PCT/CN2019/102307 with English Translation.

May 26, 2020—International Search Report of the International Appn PCT/CN2019/102819 with English Translation.

Jul. 6, 2018—U.S. Non-Final Office Action issued in the Parent U.S. Appl. No. 15/521,612.

Mar. 29, 2019—U.S. Non-Final Office Action issued in the Parent U.S. Appl. No. 15/521,612.

Jan. 14, 2019—U.S. Final Office Action issued in the Parent U.S. Appl. No. 15/521,612.

Oct. 1, 2019—U.S. Final Office Action issued in the Parent U.S. Appl. No. 15/521,612.

May 9, 2019—(EP) Extended European Search Report Appn 16852868.5.

Aug. 20, 2018—(KR) First Office Action Appn 10-2017-7009789 with English Translation.

May 8, 2019—(KR) Notice of Allowance Appn 10-2019-7009729.

Apr. 1, 2020—(JP) Search Report Appn 2017-521204 with English Translation.

Jun. 8, 2020—(JP) First Office Action Appn 2017-521204 with English Translation.

Jan. 20, 2021—(JP) Office Action Appn 2017-521204 with English Translation.

Sep. 1, 2021—CN—First Office Action Appn 201980001517.3 with English Translation.

Oct. 1, 2021—U.S.—First Office Action U.S. Appl. No. 16/916,671.

Jan. 7, 2022—U.S. Non-Final Office Action U.S. Appl. No. 16/812,619.

(56) References Cited

OTHER PUBLICATIONS

Feb. 24, 2022—U.S. Final Office Action U.S. Appl. No. 16/916,671.
Mar. 29, 2022—(IN) Office Action Appn 202017056357.
Apr. 7, 2022—(IN) Office Action Appn 202017056072.
Apr. 20, 2022—U.S. Non-Final Office Action U.S. Appl. No. 16/814,119.
May 11, 2022—(CN) First Office Action Appn 201980001452.2 with English Translation.
May 16, 2022—U.S. Final Office Action U.S. Appl. No. 16/812,619.
May 27, 2022—U.S. Non-Final Office Action U.S. Appl. No. 16/959,757.
May 30, 2022—(EP) Extended European Search Report Appn 19931503.7.
Nov. 26, 2021—U.S. Non-Final Office Action U.S. Appl. No. 16/959,398.
Mar. 24, 2022—U.S. Notice of Allowance U.S. Appl. No. 16/959,398.
Apr. 20, 2022—U.S. Corrected Notice of Allowance U.S. Appl. No. 16/959,398.
Sep. 6, 2022—(EP) Extented European Search Report Appn 19933232.1.

* cited by examiner

ELECTRONIC DEVICE SUBSTRATE, MANUFACTURING METHOD THEREOF, AND ELECTRONIC DEVICE

CROSS-REFERENCE TO RELATED APPLICATIONS

This application is a continuation of U.S. patent application Ser. No. 16/959,398 filed on Jun. 30, 2020, which is a U.S. National Phase Entry of International Application No. PCT/CN2019/102819 filed on Aug. 27, 2019. The above-identified applications are incorporated by reference herein in their entirety.

TECHNICAL FIELD

Embodiments of the present disclosure relate to an electronic device substrate, a manufacturing method thereof, and an electronic device.

BACKGROUND

Organic light-emitting diode (OLED) display panels have gradually attracted extensive attention due to its advantages of wide viewing angle, high contrast, fast response speed, higher luminous brightness and lower driving voltage compared with inorganic light-emitting display devices. Due to the above characteristics, the organic light-emitting diode (OLED) display panels can be applied in devices with display functions, such as mobile phones, displays, notebook computers, digital cameras, instruments and meters, etc. Silicon-based micro-displays (e.g., silicon-based OLED) have smaller pixel sizes and pixel pitches, thereby having higher resolution, and thus silicon-based micro-displays are suitable for applying in near-eye display devices (e.g., virtual reality display devices or augmented reality display devices).

SUMMARY

At least one embodiment of the present disclosure provides an electronic device substrate, and the electronic device substrate comprises a base substrate, a first insulating layer, a plurality of light-emitting sub-units, a first conductive member, and a second conductive member. the plurality of light-emitting sub-units, the first conductive member, and the second conductive member are on a side of the first insulating layer away from the base substrate; the plurality of light-emitting sub-units are in an array region of the electronic device substrate, the first conductive member is in a periphery region, surrounding the array region, of the electronic device substrate, and the second conductive member is between the first conductive member and the array region; an orthographic projection of the first conductive member on the base substrate and an orthographic projection of the second conductive member on the base substrate are spaced apart; each of the plurality of light-emitting sub-units comprises a first driving electrode and a second driving electrode, the first driving electrode and the second driving electrode are configured to apply a light-emitting driving voltage, second driving electrodes of the plurality of light-emitting sub-units are integrated to form a first common electrode layer; the periphery region further comprises a second common electrode layer, the first conductive member is electrically connected to the second common electrode layer, and the second common electrode layer is electrically connected to the first common electrode layer; and the first conductive member, the second conductive member, and the first driving electrode are all in direct contact with the first insulating layer.

For example, in at least one example of the electronic device substrate, the first conductive member and the second conductive member are laminated with the second common electrode; the first conductive member, the second conductive member, and the first driving electrode are in a same conductive structure layer; the orthographic projection of the first conductive member on the base substrate, the orthographic projection of the second conductive member on the base substrate, and an orthographic projection of the first driving electrode on the base substrate are spaced apart; and the second common electrode layer and the first common electrode layer are integrated to form a common electrode layer.

For example, in at least one example of the electronic device substrate, the second conductive member is directly connected to the second common electrode layer electrically.

For example, in at least one example of the electronic device substrate, the second conductive member comprises a plurality of first electrode patterns spaced apart, and the plurality of first electrode patterns are arranged in a ring shape as a whole.

For example, in at least one example of the electronic device substrate, the first conductive member is a continuous first annular structure.

For example, in at least one example of the electronic device substrate, the first conductive member comprises a plurality of second electrode patterns spaced apart, and the plurality of second electrode patterns are arranged in a ring shape as a whole.

For example, in at least one example of the electronic device substrate, a shape of the second electrode patterns, a shape of the first electrode patterns, and a shape of the first driving electrode are substantially identical to each other.

For example, in at least one example of the electronic device substrate, a size of the second electrode patterns, a size of the first electrode patterns, and a size of the first driving electrode are substantially equal.

For example, in at least one example of the electronic device substrate, the first conductive member is a continuous first annular structure, and the second conductive member is a continuous second annular structure.

For example, in at least one example of the electronic device substrate, the second conductive member is not directly connected to the first conductive member electrically.

For example, in at least one example of the electronic device substrate, in a direction from the array region to the periphery region, a ring width of the second conductive member is less than a ring width of the first conductive member.

For example, in at least one example of the electronic device substrate, in a direction from the array region to the periphery region, a pitch between the first conductive member and the second conductive member is equal to a pitch between first driving electrodes of adjacent light-emitting sub-units.

For example, in at least one example of the electronic device substrate, the electronic device substrate further comprises a third conductive member, the third conductive member is on the side of the first insulating layer away from the base substrate; the third conductive member surrounds the array region and in the same conductive structure layer, and the second conductive member surrounds the third conductive member; each of the plurality of light-emitting sub-units comprises a light-emitting layer, and light-emitting layers of the plurality of light-emitting sub-units are integrated to form a light-emitting material layer; and the light-emitting material layer extends onto the third conductive member and at least partially overlaps with the third conductive member.

For example, in at least one example of the electronic device substrate, in a direction from the array region to the periphery region, a pitch between the second conductive member and the third conductive member is equal to a pitch between the second conductive member and the first conductive member, and a ring width of the second conductive member is equal to a ring width of the third conductive member.

For example, in at least one example of the electronic device substrate, the first driving electrode is an anode, the second driving electrode is a cathode, and the first conductive member is a cathode ring; an orthographic projection of the second common electrode layer on a plane where the first driving electrode is located is a continuous plane; and the orthographic projection of the second common electrode layer on the plane where the first driving electrode is located completely covers the first conductive member.

For example, in at least one example of the electronic device substrate, the periphery region further comprises a fourth conductive member surrounding the first conductive member; the fourth conductive member is on the side of the first insulating layer away from the base substrate; and the fourth conductive member is laminated with the second common electrode and electrically connected to the second common electrode layer.

For example, in at least one example of the electronic device substrate, the first insulating layer comprises a recess portion; the recess portion is on a side of the first insulating layer closer to the first conductive member, and is between an orthographic projection of the first conductive member on the first insulating layer and an orthographic projection of the first driving electrode on the first insulating layer; and an orthographic projection of the recess portion on the base substrate, the orthographic projection of the first conductive member on the base substrate, the orthographic projection of the second conductive member on the base substrate, and an orthographic projection of the first driving electrode on the base substrate do not overlap.

For example, in at least one example of the electronic device substrate, the electronic device substrate further comprises an intermediate conductive layer, the first insulating layer comprises a first via-hole and a second via-hole; the intermediate conductive layer is at a side of the first insulating layer away from the first driving electrode, and the intermediate conductive layer comprises a first conductive structure and a second conductive structure; the first driving electrode is electrically connected to the first conductive structure via the first via-hole, the second driving electrode is electrically connected to the second conductive structure via the first conductive member and the second via-hole, and the second conductive member and the intermediate conductive layer are not directly connected electrically.

For example, in at least one example of the electronic device substrate, the orthographic projection of the second conductive member on the base substrate, an orthographic projection of the first conductive structure on the base substrate, and an orthographic projection of the second conductive structure on the base substrate are spaced apart.

For example, in at least one example of the electronic device substrate, the electronic device substrate further comprises a second insulating layer and a driving back plate which are on a side of the intermediate conductive layer away from the first driving electrode; the driving back plate comprises the base substrate; the second insulating layer is between the intermediate conductive layer and the driving back plate; the second insulating layer comprises a third via-hole and a fourth via-hole; and the first driving electrode is electrically connected to a first region of the driving back plate via the first via-hole, the first conductive structure, and the third via-hole, the second driving electrode is electrically connected to a second region of the driving back plate via the first conductive member, the second via-hole, the second conductive structure, and the fourth via-hole, and the second conductive member is not directly connected to the driving back plate electrically.

For example, in at least one example of the electronic device substrate, the second conductive member does not directly receive signals provided by the driving back plate.

For example, in at least one example of the electronic device substrate, the second conductive member is floating.

For example, in at least one example of the electronic device substrate, the first conductive member is a continuous first annular structure, and the second conductive member is a continuous second annular structure; the periphery region further comprises an electrical connection portion which is between the first conductive member and the second conductive member and in the same conductive structure layer; the first conductive member and the second conductive member are connected through the electrical connection portion.

At least one embodiment of the present disclosure further provides an electronic device, comprising any electronic device substrate provided by at least one embodiment of the present disclosure.

At least one embodiment of the present disclosure provides a manufacturing method of an electronic device substrate, comprising: providing a base substrate; forming a first insulating layer on the base substrate; and forming a plurality of light-emitting sub-units, a first conductive member and a second conductive member on a side of the first insulating layer away from the base substrate. The plurality of light-emitting sub-units are in an array region of the electronic device substrate, the first conductive member is in a periphery region, surrounding the array region, of the electronic device substrate, and the second conductive member is between the first conductive member and the array region; an orthographic projection of the first conductive member on the base substrate and an orthographic projection of the second conductive member on the base substrate are spaced apart; each of the light-emitting sub-units comprises a first driving electrode and a second driving electrode, the first driving electrode is laminated with the second driving electrode, the first driving electrode and the second driving electrode are configured to apply a light-emitting driving voltage, second driving electrodes of the plurality of light-emitting sub-units are integrated to form a first common electrode layer; the periphery region further comprises a second common electrode layer, the first conductive member is electrically connected to the second common electrode layer, and the second common electrode layer is electrically connected to the first common electrode layer; and the first conductive member, the second conductive member, and the first driving electrode are all in direct contact with the first insulating layer.

For example, in at least one example of the manufacturing method of the electronic device substrate, the forming the plurality of light-emitting sub-units, the first conductive member and the second conductive member on the side of the first insulating layer away from the base substrate, comprises: forming a first conductive layer; patterning the first conductive layer to form first driving electrodes of the plurality of light-emitting sub-units, the first conductive member, and the second conductive member; and forming a common electrode layer on the first driving electrodes, the first conductive member, and the second conductive member; the common electrode layer comprises the first common electrode layer and the second common electrode layer which are integrated.

BRIEF DESCRIPTION OF THE DRAWINGS

In order to clearly illustrate the technical solutions of the embodiments of the present disclosure, the drawings of the embodiments will be briefly described in the following; and it is obvious that the described drawings are only related to some embodiments of the present disclosure and thus are not limitative to the present disclosure.

DETAILED DESCRIPTION

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "comprise," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may comprise an electrical connection, directly or indirectly. "On," "under," "right," "left" and the like are only used to indicate relative position relationship, and when the position of the object which is described is changed, the relative position relationship may be changed accordingly.

The inventors of the present disclosure have noticed that the PPI (an amount of or a number of pixels per inch) of a micro-display (e.g., a silicon-based micro-display) is relatively large, and correspondingly, a size of a sub-pixel of the micro-display (e.g., a silicon-based micro-display) is relatively small. For example, for micro-displays (e.g., silicon-based micro-displays) having a size of less than 0.5 inches and a resolution of more than 5000, the size of the sub-pixel is as low as about 1.5 microns and a pitch between sub-pixels is as low as about 0.8 microns.

The inventors of the present disclosure have noticed in research that the relatively small size of the sub-pixel and the relatively small pitch of the sub-pixel increase the difficulty of the development and etching process of the micro-display and reduce the uniformity of the micro-display. An exemplary explanation will be described below with reference to FIGS. 1A and 1B.

Figure 1A:
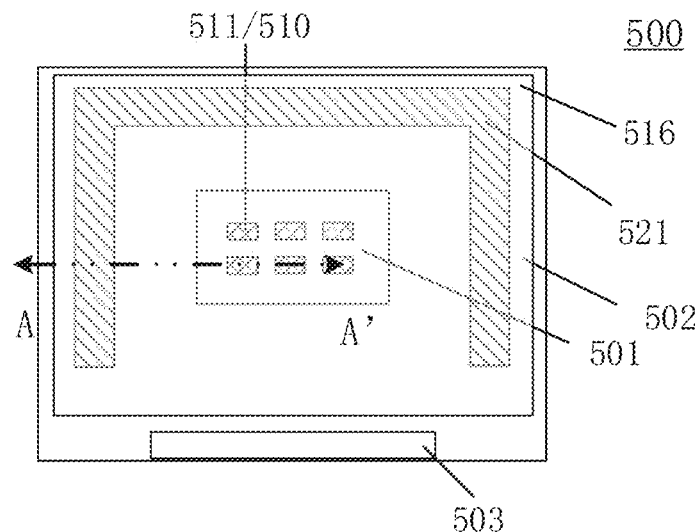
FIG. 1A is a schematically plan diagram of an electronic device substrate.
Figure 1B:
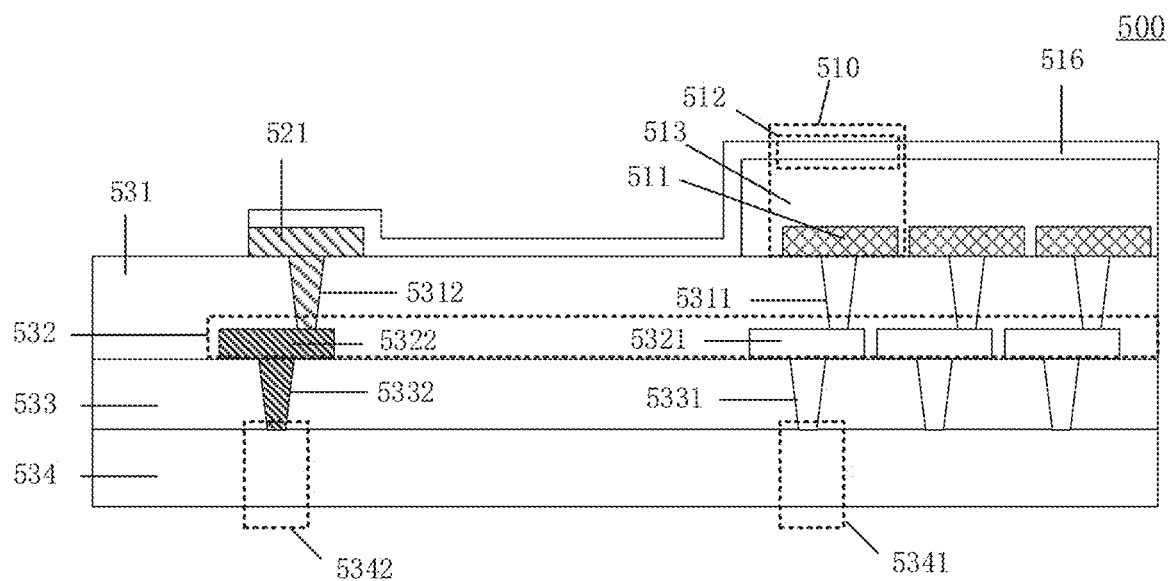
FIG. 1B is a schematically cross-sectional diagram of an electronic device substrate taken along an AA' line as illustrated in FIG. 1A.

FIG. 1A illustrates a schematically plan diagram of an electronic device substrate 500; and FIG. 1B illustrates a schematically cross-sectional diagram, along line AA', of the electronic device substrate 500 as illustrated in FIG. 1A. For example, the electronic device substrate 500 may be implemented as a display substrate (e.g., a display panel, an organic light-emitting diode display panel) or a light-emitting substrate (e.g., a backlight), etc.

As illustrated in FIG. 1A, the electronic device substrate 500 includes an array region 501 and a periphery region 502 surrounding the array region 501. The array region 501 includes a plurality of light-emitting sub-units 510, and the periphery region 502 includes a conductive member 521 (e.g., cathode conductive member or cathode switching connection member) surrounding the array region 501. For example, the periphery region 502 also includes other regions 503 (e.g., bonding regions) located at an outer side of the conductive member 521.

As illustrated in FIG. 1B, each of the plurality of light-emitting sub-units 510 includes a first driving electrode 511, a second driving electrode 512, and a light-emitting layer 513 sandwiched between the first driving electrode 511 and the second driving electrode 512. For example, the first driving electrode 511 and the second driving electrode 512 are configured to apply a light-emitting driving voltage (apply the light-emitting driving voltage to the light-emitting layer 513), such that the light-emitting layer 513 emits light, and an intensity of the light corresponds to a value of the light-emitting driving voltage.

For example, as illustrated in FIG. 1B, the first driving electrode 511 and the second driving electrode 512 are an anode and a cathode, respectively. For example, the first driving electrode 511 and the conductive member 521 are located in a same structural layer. For example, the same conductive layer (e.g., a single-layered conductive layer) may be patterned using a same patterning process to obtain the first driving electrode 511 and the conductive member 521.

For example, as illustrated in FIGS. 1A and 1B, the second driving electrodes 512 of the plurality of light-emitting sub-units 510 are integrated to form a common electrode layer 516 (e.g., a cathode layer); and the common electrode layer 516 extends from the array region 501 to the periphery region 502, and is laminated with and directly electrically connected to the conductive member 521.

For example, as illustrated in FIG. 1B, the electronic device substrate 500 further includes a first insulating layer 531, an intermediate conductive layer 532, a second insulating layer 533, and a driving back plate 534. For example, as illustrated in FIG. 1B, the first insulating layer 531, the intermediate conductive layer 532, the second insulating layer 533, and the driving back plate 534 are sequentially arranged in a direction perpendicular to the driving back plate 534, and as compared with the driving back plate 534, the first insulating layer 531 is closer to the first driving electrode 511.

For example, as illustrated in FIG. 1B, the first insulating layer 531 includes a first via-hole 5311 and a second via-hole 5312, and the intermediate conductive layer 532 includes a first conductive structure 5321 and a second conductive structure 5322; and the first driving electrode 511 is electrically connected to the first conductive structure 5321 via the first via-hole 5311, and the second driving electrode 512 is electrically connected to the second conductive structure 5322 via the conductive member 521 and the second via-hole 5312.

For example, as illustrated in FIG. 1B, the second insulating layer 533 includes a third via-hole 5331 and a fourth via-hole 5332, the first driving electrode 511 is electrically connected to a first region 5341 of the driving back plate 534 via the first via-hole 5311, the first conductive structure 5321, and the third via-hole 5331, and the second driving electrode 512 (the common electrode layer 516) is electrically connected to a second region 5342 of the driving back plate 534 via the conductive member 521, the second via-hole 5312, the second conductive structure 5322, and the fourth via-hole 5332. For example, the first region 5341 of the driving back plate 534 is configured to provide a first signal (e.g., a first voltage, an anode voltage) to the first driving electrode 511, the second region 5342 of the driving back plate 534 is configured to provide a second signal (e.g., a second voltage, a cathode voltage) to the second driving electrode 512, and the first voltage is greater than the second voltage, for example.

For example, by providing the conductive member 521, the electrical connection performance between the common electrode layer 516 (e.g., cathode layer) and the second conductive structure 5322 can be improved.

The inventors of the present disclosure have noticed in the research that a portion of the common electrode layer 516 is disposed in a gap between the conductive member 521 and the first driving electrode 511, which reduces the flatness of the common electrode layer 516, increases the risk of breakage of the common electrode layer 516 (i.e., increases the risk of disconnection), and reduces the uniformity of the electrical signal on the common electrode layer 516. For example, the inventors of the present disclosure have also noticed in research that a side of the first insulating layer 531 closer to the conductive member 521 may have a recess portion (not illustrated in the figure), and the recess portion is located between an orthographic projection of the first driving electrode 511 on the first insulating layer 531 and an orthographic projection of the conductive member 521 on the first insulating layer 531. In this case, the flatness of the common electrode layer 516 is further reduced, and the risk of breakage of the common electrode layer 516 is further increased.

The inventors of the present disclosure have also noticed in research that in the process of patterning the same conductive layer using the same patterning process to obtain the first driving electrode 511 and the conductive member 521, the uniformity of the development process and the etching process is poor.

An exemplary explanation will be given below in connection with an etching process. As illustrated in FIG. 1B, because a pitch between two first driving electrodes 511 which are adjacent is less than a pitch between a first driving electrode 511 and a conductive member 521 adjacent to the first driving electrode 511, an amount of etching liquid or etching gas located between the two first driving electrodes 511 which are adjacent is less than an amount of etching liquid or etching gas located between the first driving electrode 511 and the conductive member 521 adjacent to the first driving electrode 511 during etching. In this case, a duration required to obtain the conductive member 521 by etching is less than a duration required to obtain the first driving electrode 511 by etching, and for the first driving electrode 511 adjacent to the conductive member 521, a duration (time period) required to obtain the side of the first driving electrode 511 adjacent to the conductive member 521 by etching is less than a duration required to obtain the side of the first driving electrode 511 away from the conductive member 521 by etching, that is, there is non-uniformity in etching. The non-uniformity of the above-mentioned etching causes that the actual sizes and center positions of the conductive member 521 and the first driving electrode 511 may be deviated from design values of the sizes and center positions of the conductive member 521 and the first driving electrode 511, thereby possibly reducing the performance of the electronic device substrate 500.

The inventors of the present disclosure have also noticed in research that the conductive member 521 is only provided on three sides of the electronic device substrate 500, in this case, the uniformity degree of electrical signals on the common electrode layer 516 (e.g., cathode layer) is further deteriorated, and the uniformity of the development process and the etching process is further deteriorated.

At least one embodiment of the present disclosure provides an electronic device substrate, a manufacturing method thereof, and an electronic device. The electronic device substrate comprises a base substrate, a first insulating layer, a plurality of light-emitting sub-units, a first conductive component, and a second conductive component. The plurality of light-emitting sub-units, a first conductive member and a second conductive member are arranged on a side of the first insulating layer away from the base substrate; the plurality of light-emitting sub-units are in an array region of an electronic device substrate, a first conductive member is in a periphery region, surrounding the array region, of the electronic device substrate, and the second conductive member is between the first conductive member and the array region; an orthographic projection of the first conductive member on the base substrate and an orthographic projection of the second conductive member on the base substrate are spaced apart; each of the plurality of light-emitting sub-units includes a first driving electrode and a second driving electrode, which are configured to apply a light-emitting driving voltage, second driving electrodes of the plurality of light-emitting sub-units are integrated to form a first common electrode layer; the periphery region further includes a second common electrode layer, the first conductive member is electrically connected to the second common electrode layer, and the second common electrode layer is electrically connected to the first common electrode layer; and the first conductive member, the second conductive member and the first driving electrode are all in direct contact with the first insulating layer.

It should be noted that, in some examples or embodiments of the present disclosure, the first conductive member and the second conductive member are annular structures, and the annular structure refers to a conductive structure having an annular profile without limiting whether the annular structure is continuous. For example, the annular structure may be a continuous annular structure or may be a discontinuous annular structure formed by an arrangement of conductive patterns. For example, the annular structure may be referred to as a conductive ring (e.g., a cathode ring).

For example, in some examples or embodiments of the present disclosure, the electronic device substrate further includes at least one of a third conductive member and a fourth conductive member, and the third conductive member and the fourth conductive member are annular structures.

It should be noted that, in some examples or embodiments of the present disclosure, the expression that an A component and a B component are located in the same structural layer (e.g., the same conductive structural layer) means that both of the A component and the B component are located on the same side of a C component and are in direct contact with the C component, and an orthographic projection of the A component on the electronic device substrate and an orthographic projection of the B component on the electronic device substrate are spaced apart. For example, the expression that the A component and the B component are located in the same structural layer may also mean that the A component and the B component are obtained by patterning the same film layer (e.g., conductive layer) using the same patterning process.

For example, the electronic device substrate provided by at least one embodiment of the present disclosure may be implemented as a display substrate (e.g., a display panel, an organic light-emitting diode display panel), or a light-emitting substrate (e.g., a backlight), etc.

Non-limitative descriptions are given to the electronic device substrate provided by the embodiments of the present disclosure in the following with reference to a plurality of examples or embodiments. As described in the following, in case of no conflict, different features in these specific examples or embodiments can be combined so as to obtain new examples or embodiments, and the new examples or embodiments are also fall within the scope of present disclosure.

Figure 2A:
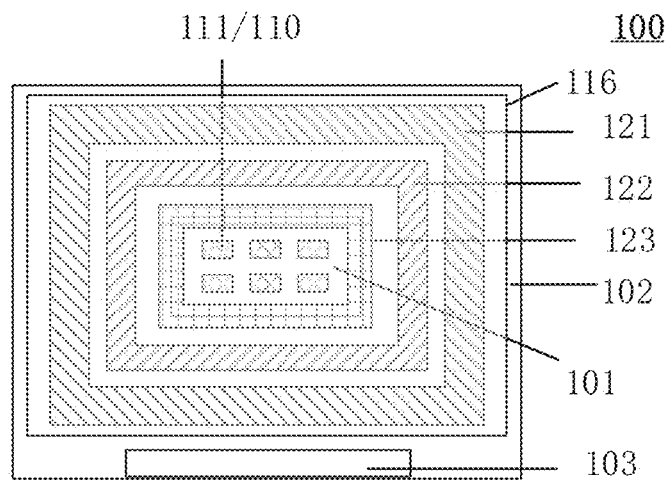
FIG. 2A is a schematically plan diagram of an electronic device substrate provided by at least one embodiment of the present disclosure.
Figure 2B:
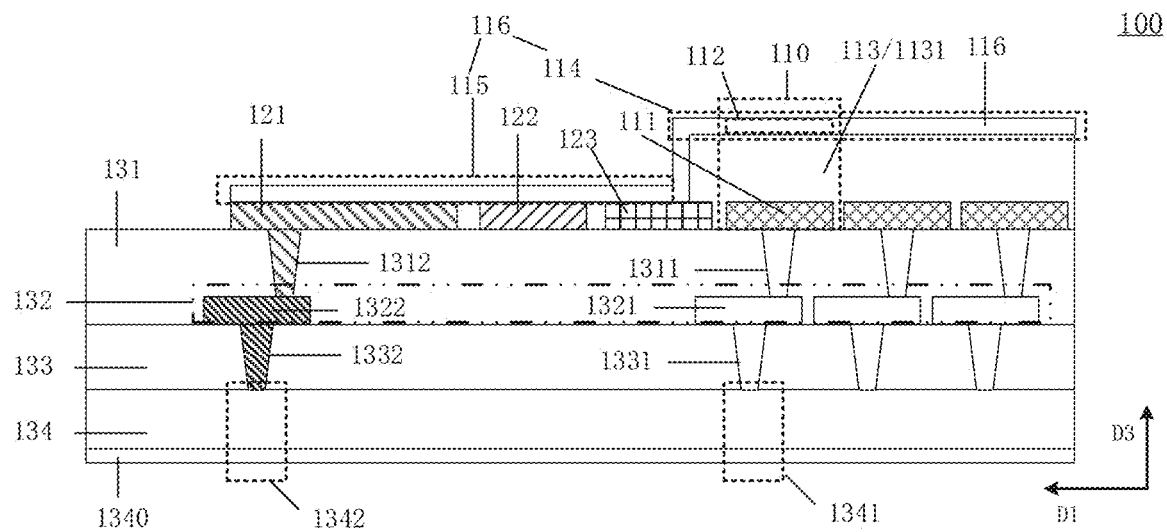
FIG. 2B is a schematically cross-sectional diagram of the electronic device substrate as illustrated in FIG. 2A.
Figure 2C:
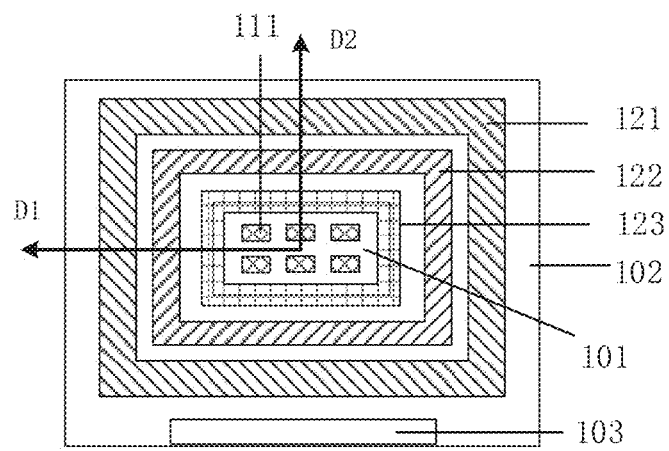
FIG. 2C is a portion of the electronic device substrate as illustrated in FIG. 2A.

FIG. 2A illustrates a schematically plan diagram of an electronic device substrate 100 provided by at least one embodiment of the present disclosure. FIG. 2B illustrates a schematically cross-sectional diagram of the electronic device substrate 100 as illustrated in FIG. 2A. FIG. 2C illustrates a portion (a common electrode layer or a cathode layer is not shown) of the electronic device substrate 100 as illustrated in FIG. 2A.

As illustrated in FIGS. 2A and 2C, the electronic device substrate 100 includes an array region 101 and a periphery region 102 surrounding the array region 101.

As illustrated in FIGS. 2A and 2C, the array region 101 includes a plurality of light-emitting sub-units 110 (e.g., display sub-pixels), which are, for example, arranged in a plurality of rows and columns (i.e., arranged in an array). It should be noted that, for the sake of clarity, the electronic device substrate 100 as illustrated in FIG. 2A only illustrates six light-emitting sub-units, but the embodiment of the present disclosure is not limited thereto, and the number of the light-emitting sub-units included in the electronic device substrate 100 can be set according to actual application requirements. For example, the electronic device substrate 100 may include 1920×1080 light-emitting sub-units.

As illustrated in FIG. 2B, each of the plurality of light-emitting sub-units 110 includes a first driving electrode 111, a second driving electrode 112, and a light-emitting layer 113 sandwiched between the first driving electrode 111 and the second driving electrode 112. For example, the first driving electrode 111 and the second driving electrode 112 are configured to apply a light-emitting driving voltage (apply the light-emitting driving voltage to the light-emitting layer 113), such that the light-emitting layer 113 emits light, an intensity of the light corresponds to a value of the light-emitting driving voltage. For example, the light-emitting driving voltage is a difference between a voltage of the first driving electrode 111 and a voltage of the second driving electrode 112.

For example, the first driving electrode 111 and the second driving electrode 112 are an anode and a cathode, respectively. For example, the light-emitting layers 113 of the plurality of light-emitting sub-units 110 are integrally formed into a light-emitting material layer 1131. For example, the light-emitting layers 113 of the plurality of light-emitting sub-units 110 are located at the same structural layer and connected to each other. For example, the light-emitting layers 113 of the plurality of light-emitting sub-units 110 are made of a same material and emit light of a same color (e.g., white light or blue light); in this case, the electronic device substrate 100 further includes a color film layer or a wavelength conversion layer (not illustrated in figures) disposed on a light-emitting side of the light-emitting sub-unit 110, the color film layer includes a plurality of filters (e.g., filters of different colors), and the plurality of filters are in one-to-one correspondence with the plurality of light-emitting sub-units 110. In other examples, light-emitting layers 113 of different light-emitting sub-units 110 (e.g., different light-emitting sub-units 110 located in a same pixel) are made of different materials and configured to emit different colors, in this case, the electronic device substrate 100 may not be provided with a color film layer.

As illustrated in FIGS. 2A and 2C, the periphery region 102 includes a first conductive member 121 surrounding the array region 101 and a second conductive member 122 disposed between the first conductive member 121 and the array region 101. For example, as illustrated in FIGS. 2A and 2C, the periphery region 102 also includes other region 103 (e.g., bonding regions) located at an outer side of the first conductive member 121.

For example, as illustrated in FIGS. 2A and 2C, the electronic device substrate 100 further includes a third conductive member 123 surrounding the array region 101, and the second conductive member 122 surrounds the third conductive member 123. As illustrated in FIG. 2B, the light-emitting material layer 1131 extends onto the third conductive member 123 and at least partially overlaps with (e.g., partially overlaps) the third conductive member 123. For example, as illustrated in FIG. 2B, the light-emitting layer 113 of a light-emitting sub-unit 110 adjacent to the third conductive member 123 extends onto the third conductive member 123 and at least partially overlaps (e.g., partially overlaps) with the third conductive member 123.

As illustrated in FIG. 2B, the electronic device substrate 100 further includes a first insulating layer 131 and a base substrate 1340. The plurality of light-emitting sub-units 110, the first conductive member 121, the second conductive member 122, and the third conductive member 123 are all disposed on a side of the first insulating layer 131 away from the base substrate 1340; and the first conductive member 121, the second conductive member 122, and the third conductive member 123 are all in direct contact with the first insulating layer 131.

For example, as illustrated in FIGS. 2A and 2C, the first conductive member 121, the second conductive member 122, and the third conductive member 123 are annular structures. For example, the annular structure may be referred to as a conductive ring (e.g., a cathode ring).

For example, an orthographic projection of the first conductive member 121 on the base substrate (not illustrated in FIG. 2B, see the base substrate 1340 of FIG. 9) of the electronic device substrate and an orthographic projection of the second conductive member 122 on the base substrate are spaced apart.

For example, as illustrated in FIGS. 2A and 2C, the second conductive member 122 is not directly electrically connected to the first conductive member 121, and the third conductive member 123 is not directly electrically connected to the second conductive member 122. It should be noted that in some examples and embodiments of the present disclosure, the non-direct electrical connection of the two conductive members means that the two conductive members are electrically insulated from each other without the aid of other conductive structures; in the case where other conductive structures are electrically connected to both of the two conductive components, the two conductive components are electrically connected. For example, the second conductive member 122 is not directly electrically connected to the first conductive member 121 without the aid of a second common electrode layer 115.

It should be noted that the third conductive member 123 may not be provided for the electronic device substrate 100 as illustrated in FIGS. 2A and 2B and the electronic device substrate 100 provided in other examples and embodiments of the present disclosure, and no further description will be given. For example, second conductive members 122 of other suitable amounts (e.g., two) may be disposed between the first conductive member 121 and the array region 101 according to actual application requirements.

For example, as illustrated in FIG. 2B, second driving electrodes 112 of the plurality of light-emitting sub-units 110 are integrated to form a first common electrode layer 114; and for example, there is no interface between the second driving electrodes 112 of adjacent light-emitting sub-units 110.

For example, as illustrated in FIG. 2B, the periphery region 102 further includes a second common electrode layer 115. The first conductive member 121, the second conductive member 122, and the third conductive member 123 are all electrically connected to the second common electrode layer 115. The second common electrode layer 115 is electrically connected to the first common electrode layer 114. For example, the first conductive member 121, the second conductive member 122, and the third conductive member 123 are all laminated with the second common electrode layer 115 and are respectively directly and electrically connected to the second common electrode layer 115.

In some embodiments, the first conductive member 121 is electrically connected to the second common electrode layer 115, and the second conductive member 122 and the third conductive member 123 are not electrically connected to the second common electrode layer 115. In this case, an insulating layer (e.g., an intermediate insulating layer 191 in FIG. 11) are provided between the second conductive member 122 (and the third conductive member 123) and the second common electrode layer 115.

For example, as illustrated in FIG. 2B, the first driving electrode 111, the first conductive member 121, the second conductive member 122, and the third conductive member 123 are located in the same structural layer; and for example, the same conductive layer (single-layered conductive layer) may be patterned by a same patterning process to obtain the first driving electrode 111, the first conductive member 121, the second conductive member 122, and the third conductive member 123.

For example, as illustrated in FIG. 2B, the second common electrode layer 115 is integrated with the first common electrode layer 114 to form the common electrode layer 116 (e.g., a cathode layer). For example, as illustrated in FIG. 2A, the common electrode layer 116 extends from the array region to the periphery region and is laminated with the first conductive member; as illustrated in FIG. 2A, the common electrode layer 116 is a continuous structure; there is no interface between the second common electrode layer 115 and the first common electrode layer 114; and in this case, the second driving electrode 112 is a portion of the common electrode layer 116 corresponding to the first driving electrode 111, and the second common electrode layer 115 is a portion of the common electrode layer 116 corresponding to conductive members (e.g., the first conductive member 121, the second conductive member 122, and the third conductive member 123).

For example, by setting the first conductive member 121 to an annular structure, the uniformity of the electrical signal on the common electrode layer 116 (e.g., the cathode layer) can be improved. For example, by making the first conductive member 121 to an annular structure, etching uniformity can also be improved.

For example, as illustrated in FIGS. 2A and 2C, by providing the second conductive member 122 and the third conductive member 123, the risk of breakage of the common electrode layer 116 can be reduced (e.g., an extension length of different regions of the common electrode layer 116 in the direction perpendicular to the panel surface of the electronic device substrate can be reduced) and the flatness of the common electrode layer 116 can be improved (e.g., to prevent a portion of the common electrode layer 116 from falling into the gap between the first conductive member 121 and the first driving electrode 111 which is adjacent to the first conductive member 121) and the uniformity of the electrical signal on the common electrode layer 116 can be improved, and the uniformity of development and etching can be improved, that is, the uniformity of a product can be improved while ensuring the success rate of the process.

For example, by providing the second conductive member 122 and the third conductive member 123, it is also possible to reduce the amount of etching liquid (or etching gas) around the first conductive member 121 in the etching process, so that the duration required to obtain the first conductive member 121 (cathode ring) by etching can be closer to the duration required to obtain the first driving electrode 111 by etching, thereby improving etching uniformity.

For example, the pitch between the first conductive member 121 and the second conductive member 122 is equal to the pitch between first driving electrodes 111 of adjacent light-emitting sub-units 110; and in this case, an amount of etching liquid (or etching gas) around the first conductive member 121 can be identical to or close to an amount of etching liquid (or etching gas) around the first driving electrode 111, thereby further improving the development and etching uniformity. For example, by enabling the pitch between the first conductive member 121 and the second conductive member 122 to be equal to the pitch between the first driving electrodes 111 of the adjacent light-emitting sub-units 110, it is also possible to prevent a portion of the common electrode layer 116 from falling into the gap between the first conductive member 121 and the second conductive member 122, thereby further improving the uniformity of electrical signals on the common electrode layer 116.

For example, the pitch between the first conductive member 121 and the second conductive member 122, the pitch between the third conductive member 123 and light-emitting sub-unit 110 adjacent to the third conductive member 123, and the pitch between the first driving electrodes 111 of the adjacent light-emitting sub-unit 110 are equal to each other, thereby further improving the uniformity of electrical signals on the common electrode layer 116 and further improving the uniformity of development and etching. For example, the pitch between the second conductive member 122 and the third conductive member 123 may also be equal to the pitch between the first driving electrodes 111 of the adjacent light-emitting sub-units 110.

For example, as illustrated in FIG. 2C, a pitch between adjacent conductive members (e.g., the pitch between the first conductive member 121 and the second conductive member 122) refers to the pitch in a direction from the array region 101 (e.g., a center of the array region 101) to the periphery region 102. For example, as illustrated in FIG. 2C, the direction from the array region 101 to the periphery region 102 may be at least one of the first direction D1 and the second direction D2 as illustrated in FIG. 2C, that is, the pitch between adjacent conductive members refers to the pitch between adjacent conductive members in the first direction D1, the pitch between adjacent conductive members in the second direction D2, or the pitch between adjacent conductive members in the first direction D1 and the pitch in the second direction D2. For example, the direction from the array region 101 to the periphery region 102 is perpendicular to an extension direction of a corresponding region of the conductive member. The first direction D1 is intersected with (e.g., is perpendicular to) the second direction D2.

For example, as illustrated in FIGS. 2A-2C, a ring width of the second conductive member 122 is less than a ring width of the first conductive member 121. For example, by enabling the ring width of the first conductive member 121 to be wider than the ring width of the second conductive member 122, an contact area (the area of the contact region) between the common electrode layer 116 and the first conductive member 121 (cathode ring) can be increased, such that a contact resistance between the common electrode layer 116 and the first conductive member 121 can be reduced, the flatness of the common electrode layer 116 can be further increased, and the risk of disconnection can be further reduced.

For example, as illustrated in FIGS. 2A-2C, the ring width of the second conductive member 122 is equal to a ring width of the third conductive member 123. For example, the ring width of the second conductive member 122 and the ring width of the third conductive member 123 are both equal to a width of the first driving electrode 111. For example, by enabling the ring width of the second conductive member 122 to be equal to the ring width of the third conductive member 123, the distribution of conductive patterns in the structural layer where the conductive member and the first driving electrode 111 are located can be more uniform, thereby further improving the uniformity of development and etching.

For example, the ring width of the conductive member refers to a width in the direction from the array region 101 to the periphery region 102 (e.g., at least one of the first direction D1 and the second direction D2), and the width (or size) of the first driving electrode 111 refers to a width (or size) of the first driving electrode 111 in the direction from the array region 101 to the periphery region 102 (e.g., at least one of the first direction D1 and the second direction D2). For example, the expression that the ring width of the conductive member is equal to the width of the electrode refers to at least one of the following expressions: the ring width of the conductive member in the first direction to be equal to the size of the electrode in the first direction, and the ring width of the conductive member in the second direction to be equal to the size of the electrode in the second direction.

For example, as illustrated in FIGS. 2A and 2C, an orthographic projection of the second common electrode layer 115 on a plane where the first driving electrode 111 is located is a continuous plane. The orthographic projection of the second common electrode layer 115 (or the common electrode layer 116) on the plane where the first driving electrode 111 is located completely covers the first conductive member 121. For example, by enabling the orthographic projection of the second common electrode layer 115 (or the common electrode layer 116) on the plane where the first driving electrode 111 to be completely cover the first conductive member 121, the contact area between the common electrode layer 116 and the first conductive member 121 (cathode ring) can be increased, such that the contact resistance between the common electrode layer 116 and the first conductive member 121 can be further reduced, and the requirements on the fabrication accuracy and alignment accuracy of the first conductive member 121 (cathode ring) can be reduced. It should be noted that the continuous plane refers to a plane without hollowed-out structures or openings.

Figure 9:
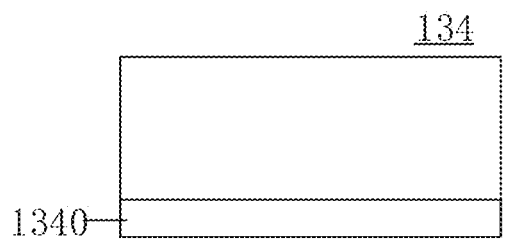
FIG. 9 is a driving back plate of an electronic device provided by at least one embodiment of the present disclosure.

For example, as illustrated in FIG. 2B, the electronic device substrate 100 further includes an intermediate conductive layer 132, a second insulating layer 133, and a driving back plate 134. For example, as illustrated in FIG. 2B, the driving back plate 134, the second insulating layer 133, the intermediate conductive layer 132, and the first insulating layer 131 are sequentially arranged in a third direction D3. As illustrated in FIG. 2B, as compared with the driving back plate 134, the first insulating layer 131 is closer to the first driving electrode 111. For example, the first direction D1, the second direction D2, and the third direction D3 intersect with each other (e.g., are perpendicular to each other). As illustrated in FIG. 9, the driving back plate 134 includes a base substrate 1340 and driving elements (not illustrated in the figure, for example, thin film transistors, capacitors, etc.) on the base substrate 1340, the base substrate 1340 is located on a side of the driving element away from the first insulating layer 131.

For example, as illustrated in FIG. 2B, the first insulating layer 131 includes a first via-hole 1311 and a second via-hole 1312, which are filled with a conductive material (e.g., a metal material), and the intermediate conductive layer 132 includes a first conductive structure 1321 and a second conductive structure 1322; the first driving electrode 111 is electrically connected to the first conductive structure 1321 via the first via-hole 1311 (conductive material in the first via-hole 1311), the second driving electrode 112 is electrically connected to the second conductive structure 1322 via the first conductive member 121 and the second via-hole 1312 (conductive material in the second via-hole 1312), and the second conductive member 122 is not directly connected to the intermediate conductive layer 132 electrically.

For example, the orthographic projection of the second conductive member 122 on the base substrate, an orthographic projection of the first conductive structure 1321 on the base substrate, and an orthographic projection of the second conductive structure 1322 on the base substrate are spaced apart, so that the second conductive member 122 is not directly connected to the intermediate conductive layer 132 electrically.

For example, as illustrated in FIG. 2B, the second insulating layer 133 includes a third via-hole 1331 and a fourth via-hole 1332, which are filled with a conductive material (e.g., a metal material), the first driving electrode 111 is electrically connected to a first region 1341 of the driving back plate 134 via the first via-hole 1311 (conductive material in the first via-hole 1311), the first conductive structure 1321, and the third via-hole 1331 (conductive material in the third via-hole 1331); the second driving electrode 112 is electrically connected to a second region 1342 of the driving back plate 134 via the first conductive member 121, the second via-hole 1312 (conductive material in the second via-hole 1312), the second conductive structure 1322, and the fourth via-hole 1332 (conductive material in the fourth via-hole 1332), and the second conductive member 122 is not directly connected to the driving back plate 134 electrically. For example, the first region 1341 of the driving back plate 134 is configured to provide a first signal (e.g., a first voltage, an anode voltage) to the first driving electrode 111, and the second region 1342 of the driving back plate 134 is configured to provide a second signal (e.g., a second voltage, a cathode voltage) to the first driving electrode 111, the first voltage is greater than the second voltage, for example. For example, first signals provided by the first region 1341 to the first driving electrodes 111 of the plurality of light-emitting sub-units may be set according to actual application requirements (e.g., may be different from each other). For example, second signals provided by the first region 1341 to the second driving electrodes 112 of the plurality of light-emitting sub-units may be equal to each other. For example, the first signals and the second signals may be referred to as pixel driving signals. For example, the second signal may be referred to as a power supply signal.

For example, the non-direct electrical connection between the second conductive member 122 and the driving back plate 134 means that the second conductive member 122 does not directly receive signals provided by the driving back plate 134. For example, as illustrated in FIG. 2B, regions of the first insulating layer 131 and the second insulating layer 133 corresponding to the second conductive member 122 (i.e., the region, which overlaps the orthographic projection of the second conductive member 122 on the first insulating layer 131, of the first insulating layer 131 and the region, which overlaps the orthographic projection of the second conductive member 122 on the second insulating layer 133, of the second insulating layer 133) are not provided with via-holes, and therefore, the second conductive member 122 cannot directly receive signals provided by the driving back plate 134 through via-holes in the first insulating layer 131 and the second insulating layer 133. For example, in the case where the second conductive member 122 is not electrically connected to the second common electrode layer, the second conductive member 122 is in a floating state. For example, in the case where the second conductive member 122 is electrically connected to the second common electrode layer, the second conductive member 122 may receive the signals provided by the driving back plate 134 via the second common electrode layer.

For example, as illustrated in FIG. 2B, the amount of the first driving electrodes 111, an amount of the first via-holes 1311, an amount of first conductive structures 1321, and an amount of third via-holes 1331 are equal to each other. For example, the first insulating layer 131 includes a plurality of second via-holes 1312; in this case, orthographic projections of the plurality of second via-holes 1312 on the second insulating layer 133 is arranged in a ring shape as a whole, and the common electrode layer 116 (the second driving electrode 112) is electrically connected to the second conductive structure 1322 and the second region 1342 of the driving back plate 134 via the first conductive member 121 and the plurality of second via-holes 1312. For example, by allowing the first insulating layer 131 to comprises the plurality of second via-holes 1312, the delay caused by a resistance and a capacitance can be reduced, and the uniformity of signals on the common electrode layer 116 (the second driving electrode 112) can be improved. For example, the common electrode layer 116 is a whole piece of electrode.

For example, the second conductive structures 1322 may be a continuous annular structure, in which case the amount of the second conductive structures 1322 is one; for another example, the second conductive structure 1322 may also be a discontinuous annular structure formed by a plurality of conductive patterns; and in this case, the amount of conductive patterns of the second conductive structure 1322 is equal to the amount of the second via-holes 1312.

For example, the electronic device substrate 100 further includes a first encapsulation layer, a color film layer, and a second encapsulation layer (not illustrated in the figures) sequentially disposed on a side of the common electrode layer 116 away from the second driving electrode 112 in the third direction D3, and the second encapsulation layer is located on a side of the first encapsulation layer away from the common electrode layer 116. For example, both the first encapsulation layer and the second encapsulation layer can protect the light-emitting layer 113, and the capability of the second encapsulation layer in protecting the light-emitting layer 113 is better than the capability of the first encapsulation layer in protecting the light-emitting layer 113.

For example, as illustrated in FIGS. 2A and 2C, the first conductive member 121, the second conductive member 122, and the third conductive member 123 are implemented as rectangular rings, but embodiments of the present disclosure are not limited thereto. For example, the first conductive member 121, the second conductive member 122, and the third conductive member 123 may also be implemented as circular rings or rings having other suitable shapes.

For example, as illustrated in FIGS. 2A and 2C, the first conductive member 121, the second conductive member 122, and the third conductive member 123 are all continuous annular structures. For example, the first conductive member 121 is a continuous first annular structure, the second conductive member 122 is a continuous second annular structure, and the third conductive member 123 is a continuous third annular structure, but embodiments of the present disclosure are not limited thereto.

For example, one or more of the first conductive member 121, the second conductive member 122, and the third conductive member 123 may include a plurality of electrode patterns spaced apart.

For example, by enabling one or more of the first conductive member 121, the second conductive member 122, and the third conductive member 123 to include a plurality of electrode patterns spaced apart, the uniformity of development and etching can be further improved, and thus the performance of the electronic device substrate 100 can be further improved. For example, by enabling one or more of the first conductive member 121, the second conductive member 122, and the third conductive member 123 to include a plurality of electrode patterns spaced apart, etching liquid (or etching gas) can flow through gaps between the plurality of electrode patterns, such that the duration required to enable the etching liquid (or etching gas) to be stably distributed (e.g., stably uniformly distributed) can be reduced.

Figure 3A:
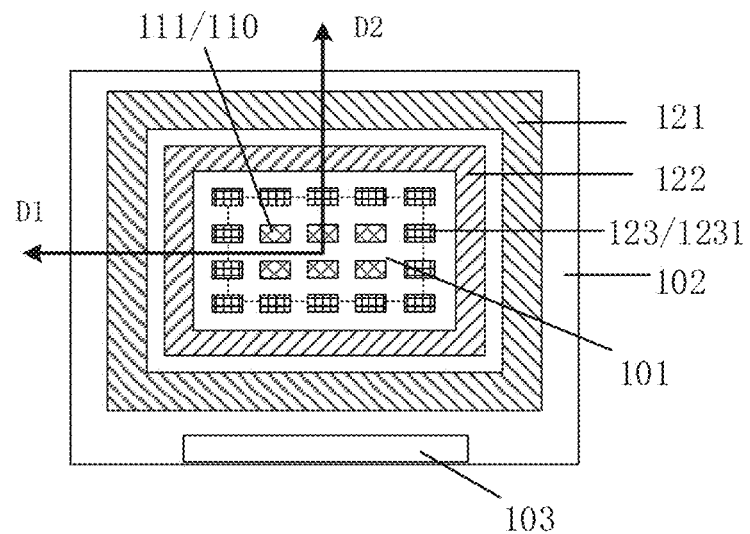
FIG. 3A is a schematically plan diagram of another electronic device substrate provided by at least one embodiment of the present disclosure.
Figure 3B:
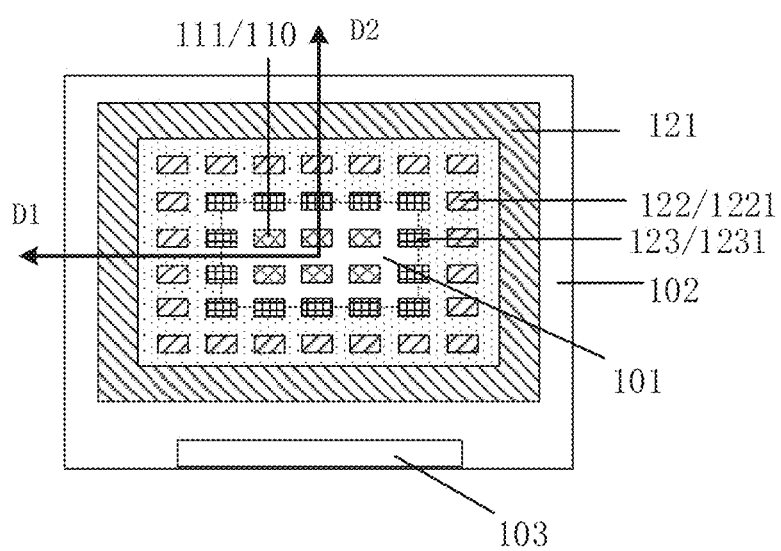
FIG. 3B is a schematically plan diagram of yet another electronic device substrate provided by at least one embodiment of the present disclosure.

Next, an exemplary explanation will be made with reference to FIGS. 3A and 3B. FIG. 3A is a schematically plan diagram of another electronic device substrate 100 provided by at least one embodiment of the present disclosure; FIG. 3B is a schematically plan diagram of yet another electronic device substrate 100 provided by at least one embodiment of the present disclosure. For the sake of clarity, neither FIG. 3A nor FIG. 3B illustrates a common electrode layer.

In an example, as illustrated in FIG. 3A, the first conductive member 121 and the second conductive member 122 are both continuous annular structures, the third conductive member 123 includes a plurality of third electrode patterns 1231 spaced apart, and the plurality of third electrode patterns 1231 are arranged in a ring shape as a whole.

For example, as illustrated in FIG. 3A, the third electrode patterns 1231 have the shape and size same as that of the first driving electrodes 111. In this case, the uniformity of development and etching and the performance of the electronic device substrate 100 can be further improved. For example, by enabling the third electrode patterns 1231 and the first driving electrodes 111 to have the same shape and size, the third electrode patterns 1231 and the first driving electrodes 111 can have the same blocking ability to the etching liquid (or etching gas), thereby further reducing the duration required to enable the etching liquid (or etching gas) to be stably distributed (e.g., stably uniformly distributed).

For example, as illustrated in FIG. 3A, a pitch between adjacent third electrode patterns 1231 is equal to the pitch between adjacent first driving electrodes 111. For example, the pitch between adjacent third electrode patterns 1231 in the first direction D1 is equal to the pitch between adjacent first driving electrodes 111 in the first direction D1, and/or the pitch between adjacent third electrode patterns 1231 in the second direction D2 is equal to the pitch between adjacent first driving electrodes 111 in the second direction D2; and in this case, the uniformity of development and etching and the performance of the electronic device substrate 100 can be further improved.

In another example, as illustrated in FIG. 3B, the first conductive member 121 is a continuous annular structure; the second conductive member 122 includes a plurality of first electrode patterns 1221 spaced apart, and the plurality of first electrode patterns 1221 are arranged in a ring shape as a whole; and the third conductive member 123 includes a plurality of third electrode patterns 1231 spaced apart, and the plurality of third electrode patterns 1231 are arranged in a ring shape as a whole. For example, as illustrated in FIG. 3B, the third electrode patterns 1231, the second electrode patterns 1211, and the first driving electrodes 111 all have the same shape and size.

For example, as illustrated in FIG. 3B, the pitch between adjacent third electrode patterns 1231, the pitch between adjacent second electrode patterns 1211, and the pitch between adjacent first driving electrodes 111 are equal to each other. In this case, the uniformity of development and etching and the performance of the electronic device substrate 100 can be further improved. For example, as illustrated in FIG. 3B, in the direction from the array region 101 to the periphery region 102 (e.g., the first direction D1 and/or the second direction D2), the pitch between the first electrode pattern 1221 and the first conductive member 121 adjacent to the first electrode pattern 1221, the pitch between the third electrode pattern 1231 and the first driving electrode 111 adjacent to the third electrode pattern 1231, and the pitch between the adjacent first driving electrodes 111 are equal to each other; and in this case, the uniformity of development and etching and the performance of the electronic device substrate 100 can be further improved. For example, the pitch between the third electrode patterns 1231 and first electrode patterns 1221 may also be equal to the pitch between adjacent first driving electrodes 111.

Figure 4A:
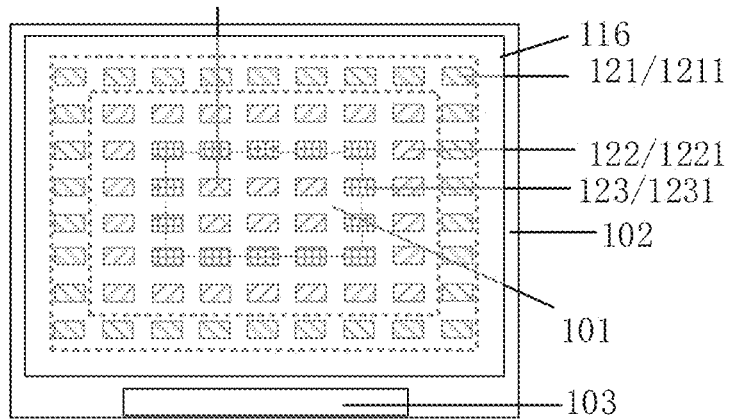
FIG. 4A is a schematically plan diagram of yet another electronic device substrate provided by at least one embodiment of the present disclosure.
Figure 4B:
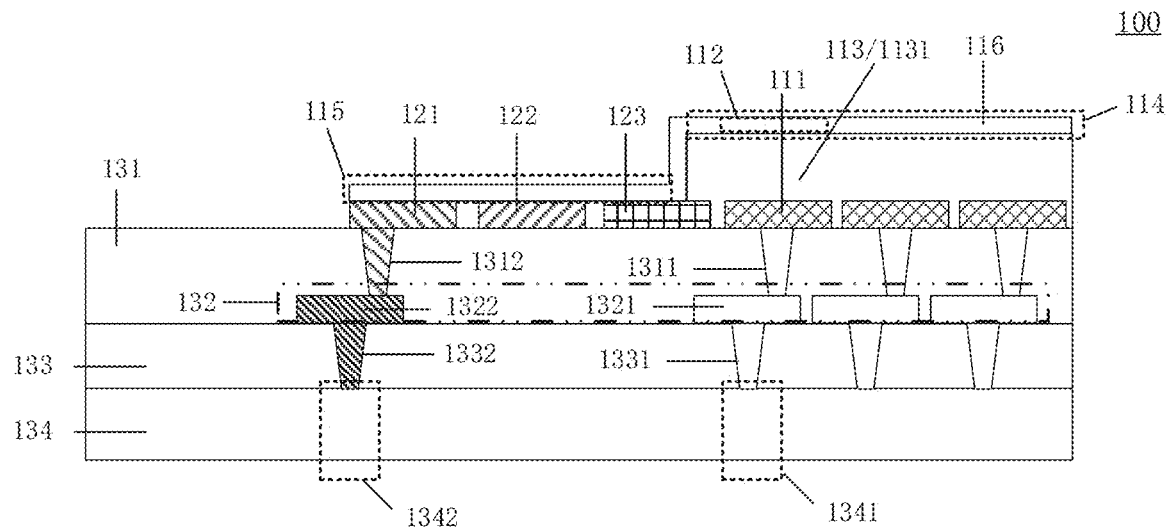
FIG. 4B is a schematically cross-sectional diagram of the electronic device substrate as illustrated in FIG. 4A.
Figure 4C:
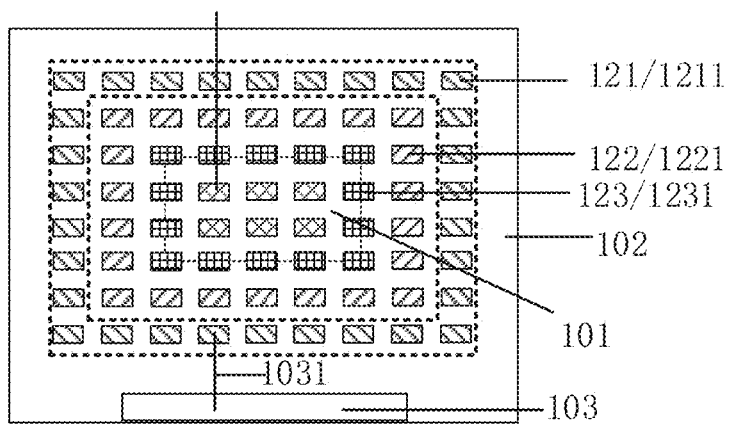
FIG. 4C is a portion of the electronic device substrate as illustrated in FIG. 4A.

FIG. 4A illustrates a schematically plan diagram of yet another electronic device substrate 100 provided by at least one embodiment of the present disclosure. FIG. 4B illustrates a schematically cross-sectional diagram of the electronic device substrate 100 as illustrated in FIG. 4A. FIG. 4C illustrates a portion (a common electrode layer or a cathode layer are not shown) of the electronic device substrate 100 as illustrated in FIG. 4A. The electronic device substrate 100 as illustrated in FIG. 4A and FIG. 4B is similar to the electronic device substrate 100 as illustrated in FIG. 2A and FIG. 2B. Only the differences between the two electronic device substrate are described here, and the similarities are not repeated here.

As illustrated in FIGS. 4A-4C, as compared with the electronic device substrate 100 as illustrated in FIGS. 2A and 2B, the electronic device substrate 100 as illustrated in FIGS. 4A-4C has the following differences: (1) the ring width of the first conductive member 121 of the electronic device substrate 100 as illustrated in FIGS. 4A and 4B is equal to the ring width of the second conductive member 122; (2) each of the first conductive member 121, the second conductive member 122, and the third conductive member 123 includes a plurality of electrode patterns spaced apart.

For example, by enabling the ring width of the first conductive member 121 to be equal to the ring width of the second conductive member 122, the uniformity of development and etching and the performance of the electronic device substrate 100 can be further improved.

For example, as illustrated in FIGS. 4A and 4C, the first conductive member 121 includes a plurality of second electrode patterns 1211 spaced apart, and the plurality of second electrode patterns 1211 are arranged in a ring shape as a whole; the second conductive member 122 includes a plurality of first electrode patterns 1221 spaced apart, and the plurality of first electrode patterns 1221 are arranged in a ring shape as a whole; the third conductive member 123 includes a plurality of third electrode patterns 1231 spaced apart, and the plurality of third electrode patterns 1231 are arranged in a ring shape as a whole; in this case, the uniformity of development and etching and the performance of the electronic device substrate 100 can be further improved. For example, as illustrated in FIG. 3C, the third electrode patterns 1231, the second electrode patterns 1211, the first electrode patterns 1221, and the first driving electrodes 111 have substantially the same (e.g., the same) shape and size; and in this case, the uniformity of development and etching and the performance of the electronic device substrate 100 can be further improved. It should be noted that the expression of having substantially the same shape represents that the shapes are substantially the same, for example, the third electrode patterns 1231, the second electrode patterns 1211, the first electrode patterns 1221, and the first driving electrodes 111 may be triangular, quadrangular, hexagonal, etc.; the expression of having substantially the same size represents that the sizes are substantially the same, the difference of the sizes of any two of the third electrode patterns 1231, the second electrode patterns 1211, the first electrode patterns 1221, and the first driving electrodes 111 are allowed to have an error range within 10%; and for example, the third electrode patterns 1231, the second electrode patterns 1211, the first electrode patterns 1221, and the first driving electrodes 111 have substantially the same (e.g., the same) areas. For example, the expression of having substantially the same area represents that the areas are substantially the same, the difference of the areas of any two of the third electrode patterns 1231, the second electrode patterns 1211, the first electrode patterns 1221, and the first driving electrodes 111 are allowed to have an error range within 10%. For example, as illustrated in FIG. 4A, in a direction from the array region 101 to the periphery region 102 (e.g., the first direction D1 and/or the second direction D2), the pitch between the first electrode pattern 1221 and the second electrode pattern 1211 adjacent to the first electrode pattern 1221, the pitch between the third electrode pattern 1231 and the first driving electrode 111 adjacent to the third electrode pattern 1231, and the pitch between adjacent first driving electrodes 111 are substantially the same (e.g., are the same); in this case, the uniformity of development and etching and the performance of the electronic device substrate 100 can be further improved. For example, the pitch between adjacent third electrode pattern 1231 and first electrode pattern 1221 may also be equal to the pitch between adjacent first driving electrodes 111. It should be noted that the substantial equality between an A parameter and a B parameter represents that the difference between the A parameter and the B parameter is less than 10%×(an average value of the A parameter and the B parameter).

For example, as illustrated in FIGS. 4A and 4C, the plurality of electrode patterns (third electrode patterns 1231, second electrode patterns 1211, and first electrode patterns 1221) are arranged in a plurality of rows and a plurality of columns (i.e., arranged in an array). For example, as illustrated in FIGS. 4A and 4C, adjacent electrode patterns in the plurality of electrode patterns are not directly connected to each other electrically; and for example, gaps exist between adjacent electrode patterns in the plurality of electrode patterns.

For example, as illustrated in FIG. 4C, the periphery region 102 also includes other region 103 (e.g., bonding regions) located at an outer side of the first conductive member 121. For example, the periphery region 102 further includes a lead 1031 that extends from a driving circuit located in the other region 103 (e.g., bonding regions) to the second electrode pattern 1211 of the first conductive member 121.

Figure 5A:
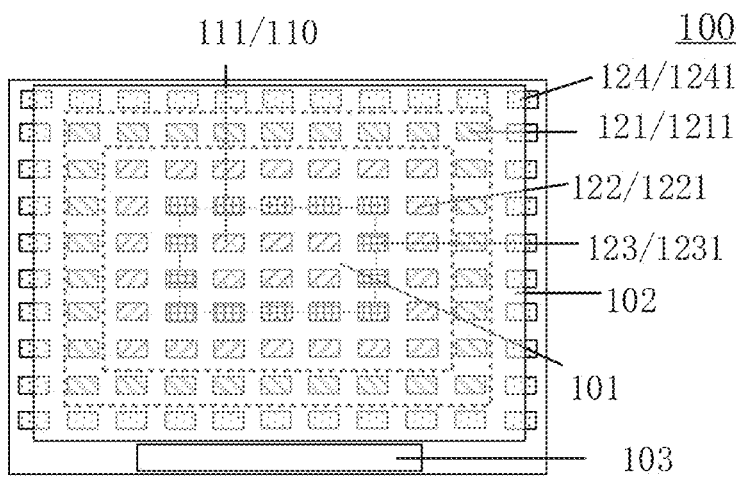
FIG. 5A is a schematically plan diagram of yet another electronic device substrate provided by at least one embodiment of the present disclosure.
Figure 5B:
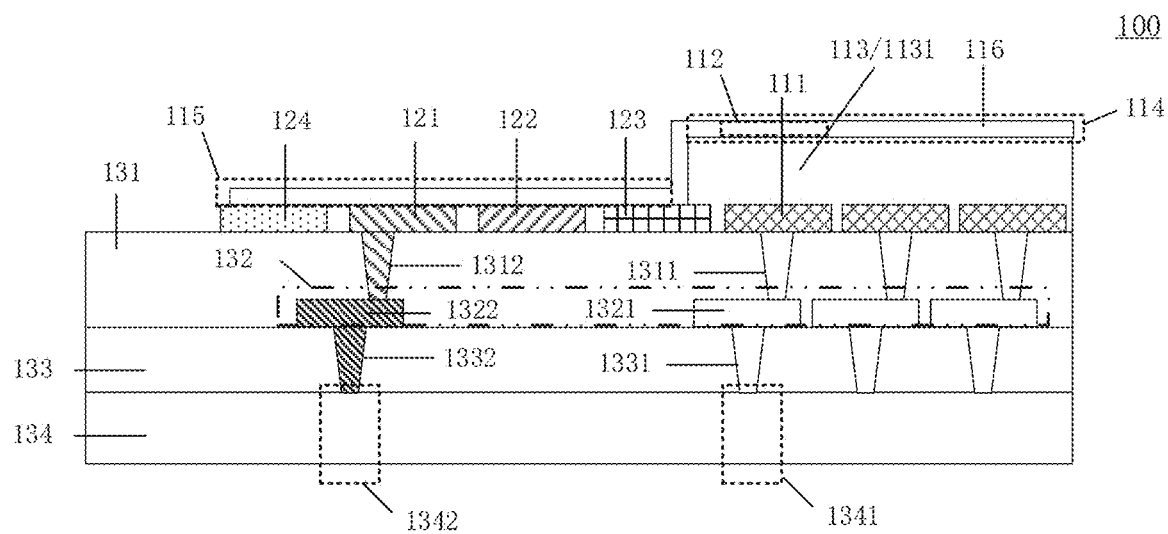
FIG. 5B is a schematically cross-sectional diagram of the electronic device substrate as illustrated in FIG. 5A.
Figure 5C:
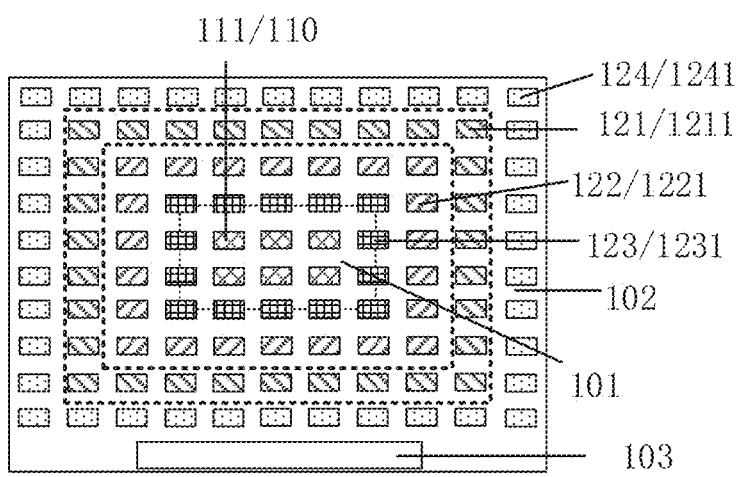
FIG. 5C is a portion of the electronic device substrate as illustrated in FIG. 5A.

FIG. 5A illustrates a schematically plan diagram of yet another electronic device substrate 100 provided by at least one embodiment of the present disclosure. FIG. 5B illustrates a schematically cross-sectional diagram of the electronic device substrate 100 as illustrated in FIG. 5A. FIG. 5C illustrates a portion (not shown a common electrode layer or a cathode layer) of the electronic device substrate 100 as illustrated in FIG. 5A. The electronic device substrate 100 as illustrated in FIGS. 5A and 5B is similar to the electronic device substrate 100 as illustrated in FIGS. 4A-4C. Only the differences between the two electronic device substrates are described here, and the similarities are not repeated here again.

As illustrated in FIGS. 5A-5C, as compared with the electronic device substrate 100 as illustrated in FIGS. 4A-4C, the periphery region 102 of the electronic device substrate 100 as illustrated in FIGS. 5A-5C further includes a fourth conductive member 124 surrounding the first conductive member 121, the fourth conductive member 124 is laminated with and electrically connected to the second common electrode layer 115. The fourth conductive member 124 is disposed on a side of the first insulating layer 131 away from the base substrate 1340 and in direct contact with the first insulating layer 131.

For example, by enabling the periphery region 102 of the electronic device substrate 100 as illustrated in FIGS. 5A-5C to further include the fourth conductive member 124 surrounding the first conductive member 121, the uniformity of development and etching and the performance of the electronic device substrate 100 can be further improved. For example, by providing the fourth conductive member 124, the effective time required to obtain the first conductive member 121 (the outer ring of the first conductive member 121) by etching can be increased, such the effective time required to obtain the first conductive member 121 by etching can be closer to the effective time required to obtain the first driving electrode 111 by etching.

For example, as illustrated in FIGS. 5A-5C, the pitch between the fourth conductive member 124 and the first conductive member 121 is equal to the pitch between adjacent first driving electrodes 111; and in this case, the uniformity of development and etching and the performance of the electronic device substrate 100 can be further improved. For example, as illustrated in FIGS. 5A-5C, the fourth conductive member 124 includes a plurality of fourth electrode patterns 1241 spaced apart, and the plurality of fourth electrode patterns 1241 are arranged in a ring shape as a whole; and in this case, the uniformity of development and etching and the performance of the electronic device substrate 100 can be further improved. For example, the fourth electrode pattern 1241 and the first driving electrode 111 have the same shape and size.

It should be noted that the electronic device substrate 100 of other examples or embodiments of the present disclosure (for example, the examples or embodiments illustrated in FIG. 2A, FIG. 3A, FIG. 6A and FIG. 7) may also be provided with the fourth conductive member, and no further description will be given.

Figure 6A:
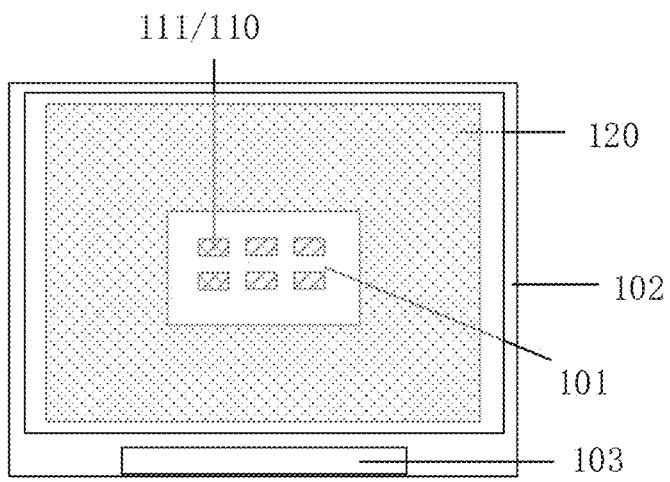
FIG. 6A is a schematically plan diagram of yet another electronic device substrate provided by at least one embodiment of the present disclosure.
Figure 6B:
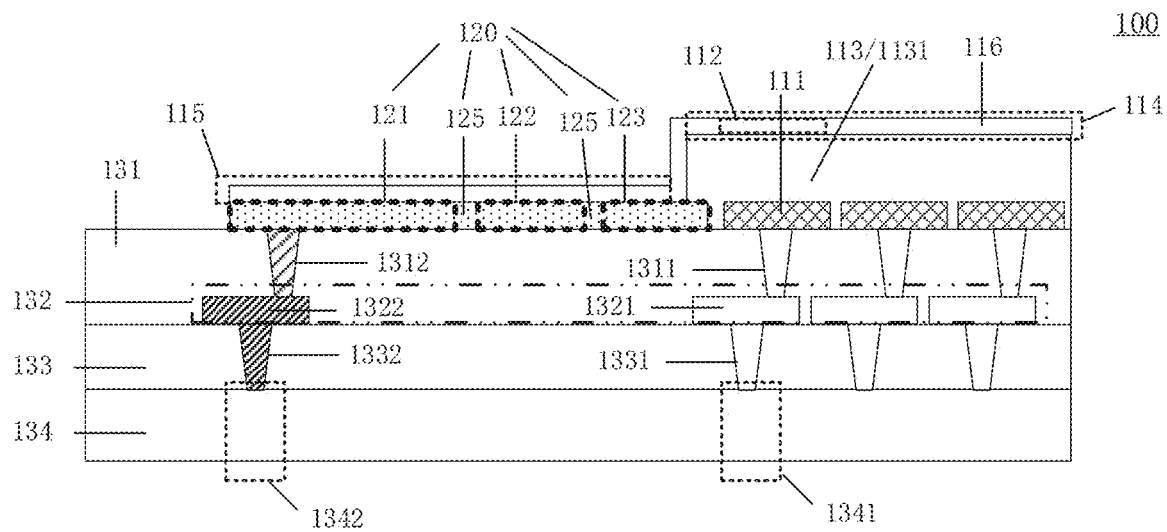
FIG. 6B is a schematically cross-sectional diagram of the electronic device substrate as illustrated in FIG. 6A.
Figure 6C:
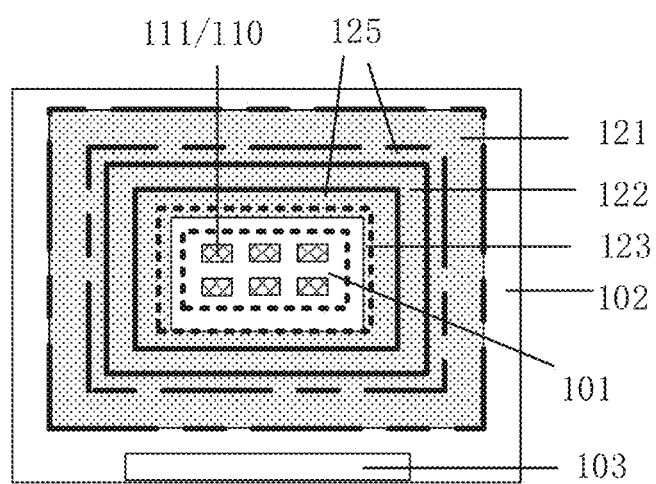
FIG. 6C is a portion of the electronic device substrate as illustrated in FIG. 6A.

FIG. 6A illustrates a schematically plan diagram of yet another electronic device substrate 100 provided by at least one embodiment of the present disclosure. FIG. 6B illustrates a schematically cross-sectional diagram of the electronic device substrate 100 as illustrated in FIG. 6A. FIG. 6C illustrates a portion (a common electrode layer or a cathode layer are not shown) of the electronic device substrate 100 as illustrated in FIG. 6A. The electronic device substrate 100 as illustrated in FIGS. 6A and 6B is similar to the electronic device substrate 100 as illustrated in FIGS. 2A-2C. Only the differences between the two electronic device substrates are described here, and the similarities are not repeated here again.

As illustrated in FIGS. 6A-6C, as compared with the electronic device substrate 100 illustrated in FIGS. 2A-2C, the periphery region 102 of the electronic device substrate 100 as illustrated in FIGS. 6A-6C further includes an electrical connection portion 125.

For example, as illustrated in FIGS. 6A-6C, the electrical connection portion 125 is disposed between the first conductive member 121 and the second conductive member 122 and between the second conductive member 122 and the third conductive member 123, the second conductive member 122 is connected to the first conductive member 121 by the electrical connection portion 125, and the second conductive member 122 is connected to the third conductive member 123 by the electrical connection portion 125. For example, the first conductive member 121 and the second conductive member 122, the third conductive member 123, and the electrical connection portion 125 are integrally formed, that is, there is no interface between any adjacent two of the first conductive member 121, the second conductive member 122, the third conductive member 123, and the electrical connection portion 125. For example, as illustrated in FIGS. 6A-6C, the first conductive member 121, the second conductive member 122, the third conductive member 123, and the electrical connection 125 form a continuous annular structure 120. For example, by providing the electrical connection 125, the contact area can be further increased and the contact resistance can be reduced.

Figure 7:
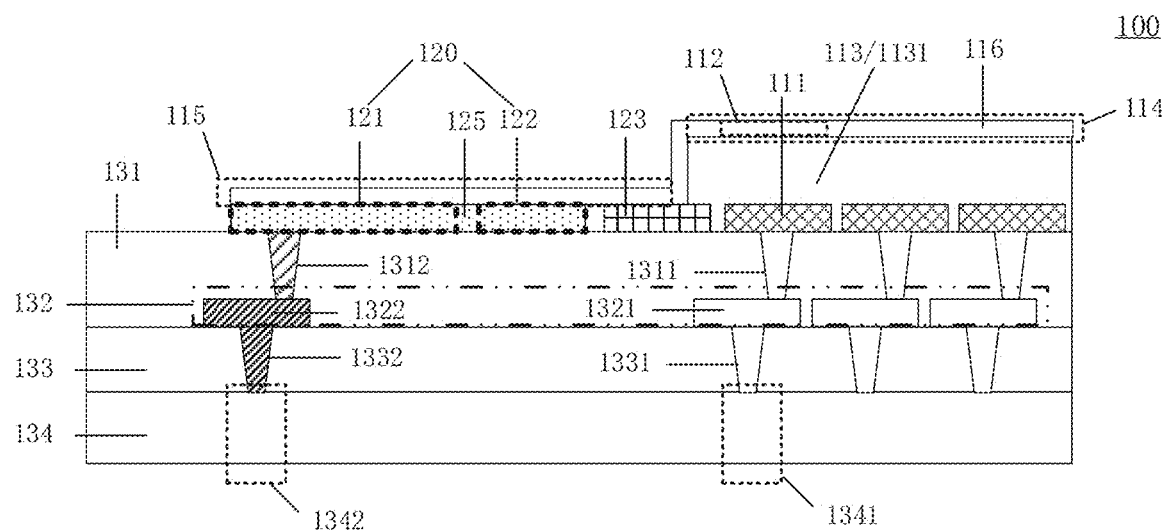
FIG. 7 is a schematically cross-sectional diagram of yet another electronic device substrate provided by at least one embodiment of the present disclosure.

It should be noted that the third conductive member 123 is not limited to being integrated with the second conductive member 122 (integrated with the second conductive member 122 via the electrical connection 125), and in some examples, the third conductive member 123 may not be directly connected to the second conductive member 122 electrically. An exemplary explanation will be made below with reference to FIG. 7. FIG. 7 illustrates a schematically cross-sectional diagram of yet another electronic device substrate 100 provided by at least one embodiment of the present disclosure. The electronic device substrate 100 as illustrated in FIG. 7 is similar to the electronic device substrate 100 as illustrated in FIGS. 6A-6C. Only the differences between the two electronic device substrates are described here, and the similarities are not repeated here again.

For example, as illustrated in FIG. 7, as compared with the electronic device substrate 100 as illustrated in FIGS. 6A-6C, the electrical connection portion 125 as illustrated in FIG. 7 is only provided between the first conductive member 121 and the second conductive member 122, and the first conductive member 121, the second conductive member 122, and the electrical connection portion 125 form a continuous annular structure 120. The annular structure 120 and the third conductive member 123 are spaced apart and are not directly connected electrically. For example, a pitch between the annular structure 120 and the third conductive member 123 (i.e., the pitch between the second conductive member 122 and the third conductive member 123), the pitch between the third conductive member 123 and the first driving electrode 111, and the pitch between adjacent first driving electrodes 111 are equal to each other.

In some examples, the first insulating layer 131 further includes a recess portion. For example, the recess portion is formed in a process of forming the first conductive member 121 and the second conductive member 122.

Figure 10:
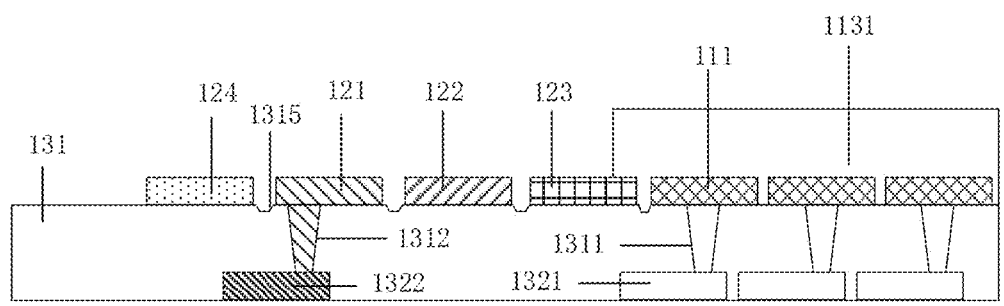
FIG. 10 illustrates a recess portion provided by at least one embodiment of the present disclosure.

FIG. 10 illustrates a recess portion 1315 provided by at least one embodiment of the present disclosure. As illustrated in FIG. 10, the recess portion 1315 is located at a side of the first insulating layer 131 closer to the first conductive member 121, and is partially located between the orthographic projection of the first conductive member 121 on the first insulating layer 131 and the orthographic projection of the first driving electrodes 111 (e.g., the first driving electrodes 111 located at an outermost edge of the array region) on the first insulating layer 131; the orthographic projection of the recess portion 1315 on the base substrate, the orthographic projection of the first conductive member 121 on the base substrate, the orthographic projection of the second conductive member 122 on the base substrate, and the orthographic projection of the first driving electrode 111 on the base substrate do not overlap. For example, orthographic projections are not overlapping means that the orthographic projections are spaced apart or the side edges of orthographic projections are in direct contact.

As illustrated in FIG. 10, a region of the first insulating layer 131 corresponding to the gap between the first conductive member 121 and the fourth conductive member 124 includes one recess portion; a region of the first insulating layer 131 corresponding to the gap between the first conductive member 121 and the second conductive member 122 includes one recess portion; a region of the first insulating layer 131 corresponding to the gap between the second conductive member 122 and the third conductive member 123 includes one recess portion; a region of the first insulating layer 131 corresponding to the gap between the third conductive member 123 and the first driving electrode 111 includes one recess portion. For example, a region of the first insulating layer 131 corresponding to the gap between adjacent first driving electrodes 111 may also include a recess portion.

For example, a region of the first insulating layer 531 of the electronic device substrate 500 of FIGS. 1A and 1B corresponding to a gap between the conductive member 521 and the first driving electrode 511 may also include one recess portion (not illustrated in FIGS. 1A and 1B). For example, as compared with the recess portion of the electronic device substrate 500 of FIGS. 1A and 1B, the recess portions in the electronic device substrate 100 which includes the first conductive member 121 to the fourth conductive member 124 and the first driving electrode 111 and is illustrated in FIG. 10 are smaller in size because the pitch between adjacent electrodes (e.g., the first conductive member 121 and the second conductive member 122) is smaller. Therefore, the flatness of the common electrode layer 116 can be further improved.

Figure 11:
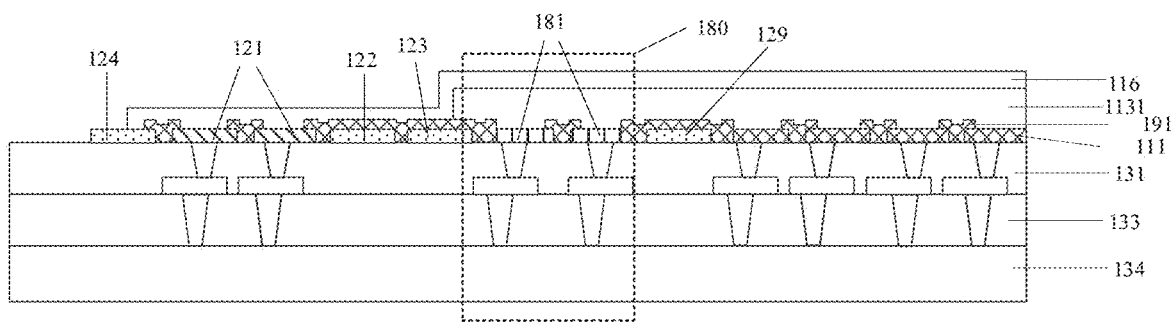
FIG. 11 is a schematically cross-sectional diagram of yet another electronic device substrate provided by at least one embodiment of the present disclosure.

FIG. 11 illustrates a schematically cross-sectional diagram of yet another electronic device substrate 100 provided by at least one embodiment of the present disclosure. The electronic device substrate 100 as illustrated in FIG. 11 is similar to the electronic device substrate 100 illustrated in FIG. 5B. Only the differences between the two electronic device substrates are described here, and the similarities are not repeated here again.

The electronic device substrate 100 as illustrated in FIG. 11 is different from the electronic device substrate 100 as illustrated in FIG. 5B, and the difference are as follows. (1) The electronic device substrate 100 as illustrated in FIG. 11 further includes a sensing region 180, the sensing region 180 is disposed between the array region and the third conductive member 123, and includes a sensing element, which can sense temperature, for example, and is electrically connected to the driving back plate 134 via via-holes (not shown). (2) The electronic device substrate 100 as illustrated in FIG. 11 further includes a fifth conductive member 129 (e.g., a conductive ring), and the fifth conductive member 129 are disposed between the sensing region 180 and the array region (e.g., between the sensing element 181 and the first driving electrode 111). (3) The electronic device substrate 100 as illustrated in FIG. 11 further includes an intermediate insulating layer 191, a first portion of the intermediate insulating layer 191 is overlapped with the third conductive member 123 and the second conductive member 122 and is located between the common electrode layer 116 and the third conductive member 123 (the second conductive member 122), so that the common electrode layer 116 and the third conductive member 123 (the second conductive member 122) are not directly connected electrically, in this case, the third conductive member 123 (the second conductive member 122) floats. For example, a second portion of the intermediate insulating layer overlaps with the fifth conductive member 129 and is located between the common electrode layer 116 and the fifth conductive member 129, so that the common electrode layer 116 and the fifth conductive member 129 are not directly electrically connected, in this case the fifth conductive member 129 floats. (4) The electronic device substrate 100 as illustrated in FIG. 11 includes two first conductive members 121.

Figure 8:
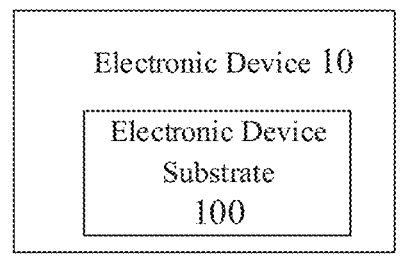
FIG. 8 is an exemplary block diagram of an electronic device provided by at least one embodiment of the present disclosure.

At least one embodiment of the present disclosure also provides an electronic device. FIG. 8 is an exemplary block diagram of an electronic device provided by at least one embodiment of the present disclosure. As illustrated in FIG. 8, the electronic device includes any electronic device substrate provided by embodiments of the present disclosure. The electronic device can be implemented as a display device, a light-emitting device, etc.

It should be noted that other components (e.g., thin film transistors, control devices, image data encoding/decoding devices, row scan drivers, column scan drivers, clock circuits, etc.) of the display panel may adopt suitable components, this should be understood by those skilled in the art, no further descriptions will be given here and it should not be construed as a limitation on the embodiments of the present disclosure.

At least one embodiment of the present disclosure provides a manufacturing method of an electronic device substrate, the manufacturing method includes: providing a base substrate; forming a first insulating layer on the base substrate; and forming a plurality of light-emitting sub-units, a first conductive member and a second conductive member on a side of the first insulating layer away from the base substrate. The plurality of light-emitting sub-units are in an array region of the electronic device substrate, the first conductive member is disposed in a periphery region, surrounding the array region, of the electronic device substrate, and the second conductive member is between the first conductive member and the array region; an orthographic projection of the first conductive member on the base substrate and an orthographic projection of the second conductive member on the base substrate are spaced apart; each of the light-emitting sub-units includes a first driving electrode and a second driving electrode which are laminated with each other, the first driving electrode and the second driving electrode are configured to apply a light-emitting driving voltage, second driving electrodes of the plurality of light-emitting sub-units are integrated to form a first common electrode layer; the periphery region further includes a second common electrode layer, the first conductive member is electrically connected to the second common electrode layer, and the second common electrode layer is electrically connected to the first common electrode layer; and the first conductive member, the second conductive member, and the first driving electrode are all in direct contact with the first insulating layer.

For example, the plurality of light-emitting sub-units are formed in the array region of the electronic device substrate, and forming the plurality of light-emitting sub-units, the first conductive member and the second conductive member on the side of the first insulating layer away from the base substrate, includes: forming a first conductive layer; patterning the first conductive layer to form first driving electrodes of the plurality of light-emitting sub-units, the first conductive member, and the second conductive member; and forming a common electrode layer on the first driving electrodes, the first conductive member, and the second conductive member. The common electrode layer comprises the first common electrode layer and the second common electrode layer which are integrated.

An exemplary explanation of a manufacturing method of an electronic device substrate provided by at least one embodiment of the present disclosure is given by taking the electronic device substrate as illustrated in FIGS. 4A-4C as an example.

For example, at least one embodiment of the present disclosure provides a manufacturing method of an electronic device substrate, the manufacturing method includes the following steps S101 to S110.

Step S101: providing a driving back plate.

For example, the driving back plate includes a first region configured to provide a first voltage and a second region configured to provide a second voltage, the first voltage is greater than the second voltage. For example, as illustrated in FIG. 9, the driving back plate may include a base substrate which is a semiconductor substrate made of monocrystalline silicon, germanium, gallium arsenide or other suitable semiconductor materials. For example, the driving back plate may be implemented as a silicon-based driving back plate, that is, the base substrate included in the driving back plate is made of monocrystalline silicon. For example, the driving back plate also includes a driving transistor, a switching transistor, a storage capacitor, etc., which are disposed on the base substrate. For example, the specific manufacturing method of the driving back plate can refer to the semiconductor integrated circuit manufacturing process, which is not repeated here again.

Step S102: forming a second insulating layer on the driving back plate, forming a third via-hole on a portion of the second insulating layer corresponding to the first region, and forming a fourth via-hole on a portion of the second insulating layer corresponding to the second region.

For example, an amount of third via-holes is equal to an amount of light-emitting sub-units to be formed. For example, an amount (e.g., one or more) of fourth via-holes can be set according to actual application requirements. For example, the second insulating layer may be made of silicon dioxide or other suitable materials.

Step S103: Filling the third via-hole and the fourth via-hole with conductive material.

For example, the conductive material may be tungsten metal (W) or other suitable material. For example, in the case where the conductive material is filled, if the conductive material is too much, part of the conductive material may be located at the outside of the via-hole; and in this case, the part of the conductive material located outside the via-hole may be removed by, for example, a grinding method to improve the electrical contact performance.

Step S104: forming an intermediate conductive layer on the side of the second insulating layer away from the driving back plate.

For example, the intermediate conductive layer includes a first conductive structure and a second conductive structure. For example, the first conductive structure and the second conductive structure may be wires or other suitable conductive structures. For example, the amount of first conductive structures, the amount of third via-holes, and the amount of light-emitting sub-units to be formed are equal to each other. For example, an amount of second conductive structures is equal to an amount of second electrode patterns of the first conductive member to be formed. For example, the plurality of second conductive structures are arranged in a ring shape surrounding the plurality of first conductive structures. For example, the first conductive structure at least partially overlaps with a corresponding third via-hole, and the second conductive structure at least partially overlaps with a corresponding fourth via-hole.

For example, each of the first conductive structure and the second conductive structure may be implemented as a multilayer structure (having multiple layers in a direction perpendicular to the driving back plate). For example, each of the first conductive structure and the second conductive structure may include three conductive layers laminated with each other, the materials of the three conductive layers laminated with each other are, for example, titanium (Ti), aluminum (Al), and titanium nitride (TiN) in sequence, and the conductive layer made of titanium (Ti) is closer to the driving back plate than the conductive layer made of titanium nitride (TiN). For another example, each of the first conductive structure and the second conductive structure may include two conductive layers laminated with each other, the materials of the two conductive layers laminated with each other are, for example, titanium (Ti) and aluminum (Al) in sequence, and the conductive layer made of titanium (Ti) is closer to the driving back plate than the conductive layer made of aluminum (Al). For example, an insulating layer is provided between adjacent conductive layers, so that the adjacent conductive layers are electrically connected through via-holes. For example, a thickness of each layer of the aminated multi-layer conductive layer is approximately in a range of 5 nm-50 nm.

Step S105: forming a first insulating layer on a side of the intermediate conductive layer away from the second insulating layer, forming a first via-hole in a portion of the first insulating layer corresponding to the first region, and forming a second via-hole in a portion of the first insulating layer corresponding to the second region.

For example, an amount of the first via-holes, an amount of the third via-holes, and the amount of light-emitting sub-units to be formed are equal to each other. For example, the amount of the second via-holes, the amount of the second conductive structures, and the amount of the second conductive patterns to be formed are equal to each other. For example, the first insulating layer may be made of silicon dioxide or other suitable materials.

Step S106: Filling the first via-hole and the second via-hole with conductive material.

For example, the conductive material may be tungsten metal (W). For example, in the case where the conductive material is filled, if the conductive material is too much, part of the conductive material may be located outside the via-hole; and in this case, the part of the conductive material located outside the via-hole may be removed by, for example, a grinding method to improve the electrical contact performance.

Step S107: forming a first conductive layer on a side of the first insulating layer away from the intermediate conductive layer, and patterning the first conductive layer (e.g., a single-layer conductive layer) by the same patterning process to form first driving electrodes of the plurality of light-emitting sub-units, a first conductive member, a second conductive member, and a third conductive member.

For example, each of the first conductive member, the second conductive member, and the third conductive member includes a plurality of electrode patterns spaced apart.

Step S108: forming a light-emitting material layer on the side, that is away from the first insulating layer, of the layer where the first driving electrodes are located. For example, as illustrated in FIG. 4B, the light-emitting material layer covers (e.g., completely covers) the first driving electrodes of the light-emitting sub-units and a portion of the third conductive member. For example, the light-emitting material layer includes light-emitting layers which is located in the same structural layer and corresponding to the plurality of light-emitting sub-units. For example, in the case where colors of light emitted by the light-emitting layers of the plurality of light-emitting sub-units are all the same, the manufacturing materials of the light-emitting layers of the plurality of light-emitting sub-units are the same and the light-emitting layers of the plurality of light-emitting sub-units are formed integrally, and there is no interface between the light-emitting layers of the plurality of light-emitting sub-units.

Step S109: forming a second conductive layer on the driving substrate on which the light-emitting material layer is formed. The second conductive layer is a common electrode layer.

Step S110: forming a first encapsulation layer, a color film layer and a second encapsulation layer sequentially on the side of the common electrode layer away from the driving substrate.

For example, the materials of the first conductive layer and the second conductive layer are selected from metals, metal alloys, and transparent conductive materials. At least one of the first conductive layer and the second conductive layer is a transparent or semitransparent electrode, and the transparent conductive material comprises indium tin oxide (ITO), indium zinc oxide (IZO), cadmium tin oxide (CTO), stannum dioxide (SnO2), zinc oxide, ZnO), and the like; metals and metal alloys include aurum (Au), aluminum (Al), indium (In), magnesium (Mg), Calcium (Ca), etc. For example, the first conductive layer is used to form an anode and the second conductive layer is used to form a cathode.

For example, by providing the second conductive member and the third conductive member, the risk of breakage of the common electrode layer can be reduced (e.g., an extension length of different regions of the common electrode layer 116 in the direction perpendicular to the panel surface of the electronic device substrate can be reduced), the flatness of the common electrode layer (e.g., a portion of the common electrode layer is prevented from falling into a gap between the first conductive member and the first driving electrode adjacent to the first conductive member) and the uniformity of electrical signals on the common electrode layer can be improved, and the uniformity of development and etching can be improved. For example, by providing the second conductive member and the third conductive member, the amount of etching liquid (or etching gas) around the first conductive member can also be reduced in the etching process, so that the duration required to obtain the first conductive member (cathode ring) by etching can be closer to the duration required to obtain the first driving electrode by etching, thereby improving etching uniformity.

Although detailed description has been given above to the present disclosure with general description and embodiments, it shall be apparent to those skilled in the art that some modifications or improvements may be made on the basis of the embodiments of the present disclosure. Therefore, all the modifications or improvements made without departing from the spirit of the present disclosure shall all fall within the scope of protection of the present disclosure.

What are described above is related to the illustrative embodiments of the disclosure only and not limitative to the scope of the disclosure; the scopes of the disclosure are defined by the accompanying claims.

What is claimed is:

1. An electronic device substrate, comprising a base substrate, a first insulating layer, a plurality of light-emitting sub-units, a first conductive member, and a second conductive member,
    wherein the plurality of light-emitting sub-units, the first conductive member, and the second conductive member are on a side of the first insulating layer away from the base substrate;
    the plurality of light-emitting sub-units are in an array region of the electronic device substrate the first conductive member is in a periphery region, surrounding the array region, of the electronic device substrate, and the second conductive member is between the first conductive member and the array region,
    an orthographic projection of the first conductive member on the base substrate and an orthographic projection of the second conductive member on the base substrate are spaced apart;
    each of the plurality of light-emitting sub-units comprises a first driving electrode and a second driving electrode, the first driving electrode and the second driving electrode are configured to apply a light-emitting driving voltage, second driving electrodes of the plurality of light-emitting sub-units are integrated to form a first common electrode layer;
    the periphery region further comprises a second common electrode layer, the first conductive member is electrically connected to the second common electrode layer, and the second common electrode layer is electrically connected to the first common electrode layer;
    the first conductive member, the second conductive member, and the first driving electrode are all in direct contact with the first insulating layer; and
    the first conductive member comprises a plurality of second electrode patterns spaced apart, and the plurality of second electrode patterns are arranged in a ring shape as a whole, wherein the second conductive member is a continuous second annular structure, and the second conductive member is not directly connected to the first conductive member electrically.

2. The electronic device substrate according to claim 1, wherein the first conductive member and the second conductive member are respectively laminated with the second common electrode layer;
    the first conductive member, the second conductive member, and the first driving electrode are in a same conductive structure layer;
    the orthographic projection of the first conductive member on the base substrate, the orthographic projection of the second conductive member on the base substrate, and an orthographic projection of the first driving electrode on the base substrate are spaced apart; and
    the second common electrode layer and the first common electrode layer are integrated to form a common electrode layer.

3. The electronic device substrate according to claim 1, wherein the second conductive member is directly connected to the second common electrode layer electrically.

4. The electronic device substrate according to claim 1, wherein
    a shape of the second electrode patterns and a shape of the first driving electrode are substantially identical to each other; and
    a size of the second electrode patterns and a size of the first driving electrode are substantially equal.

5. An electronic device substrate, comprising a base substrate, a first insulating layer, a plurality of light-emitting sub-units, a first conductive member, a second conductive member, and a third conductive member,
    wherein the plurality of light-emitting sub-units are in an array region of the electronic device substrate, the first conductive member is in a periphery region, surrounding the array region, of the electronic device substrate, and the second conductive member is between the first conductive member and the array region;
    each of the plurality of light-emitting sub-units comprises a first driving electrode and a second driving electrode, and the first driving electrode and the second driving electrode are configured to apply a light-emitting driving voltage;
    the third conductive member is on the side of the first insulating layer away from the base substrate;
    the third conductive member surrounds the array region, and the second conductive member surrounds the third conductive member;
    each of the plurality of light-emitting sub-units comprises a light-emitting layer, and light-emitting layers of the plurality of light-emitting sub-units are integrated to form a light-emitting material layer; and
    the light-emitting material layer extends onto the third conductive member and at least partially overlaps with the third conductive member.

6. The electronic device substrate according to claim 5, wherein the plurality of light-emitting sub-units, the first conductive member, and the second conductive member are on the side of the first insulating layer away from the base substrate, and the first conductive member, the second conductive member, and the first driving electrode are all in direct contact with the first insulating layer.

7. The electronic device substrate according to claim 6, wherein second driving electrodes of the plurality of light-emitting sub-units are integrated to form a first common electrode layer, the periphery region further comprises a second common electrode layer, the first conductive member is electrically connected to the second common electrode layer, and the second common electrode layer is electrically connected to the first common electrode layer.

8. The electronic device substrate according to claim 7, wherein the first conductive member, the second conductive member, and the third conductive member are respectively located in a same conductive structure layer with the first driving electrode.

9. The electronic device substrate according to claim 8, wherein the first conductive member and the second conductive member are respectively laminated with the second common electrode layer;

an orthographic projection of the first conductive member on the base substrate, an orthographic projection of the second conductive member on the base substrate, and an orthographic projection of the first driving electrode on the base substrate are spaced apart; and the second common electrode layer and the first common electrode layer are integrated to form a common electrode layer.

10. The electronic device substrate according to claim 8, wherein in a direction from the array region to the periphery region, a pitch between the second conductive member and the third conductive member is equal to a pitch between the second conductive member and the first conductive member, and a ring width of the second conductive member is equal to a ring width of the third conductive member.

11. The electronic device substrate according to claim 7, wherein the periphery region further comprises a fourth conductive member surrounding the first conductive member;

the fourth conductive member is on the side of the first insulating layer away from the base substrate; and the fourth conductive member is laminated with the second common electrode layer and electrically connected to the second common electrode layer.

12. The electronic device substrate according to claim 5, wherein an orthographic projection of the first conductive member on the base substrate and an orthographic projection of the second conductive member on the base substrate are spaced apart.

13. The electronic device substrate according to claim 12, wherein the first insulating layer comprises a recess portion;

the recess portion is on a side of the first insulating layer closer to the first conductive member, and is between an orthographic projection of the first conductive member on the first insulating layer and an orthographic projection of the first driving electrode on the first insulating layer; and an orthographic projection of the recess portion on the base substrate, the orthographic projection of the first conductive member on the base substrate, the orthographic projection of the second conductive member on the base substrate, and an orthographic projection of the first driving electrode on the base substrate do not overlap.

14. The electronic device substrate according to claim 12, further comprising an intermediate conductive layer, wherein the first insulating layer comprises a first via-hole and a second via-hole;

the intermediate conductive layer is at a side of the first insulating layer away from the first driving electrode, and the intermediate conductive layer comprises a first conductive structure and a second conductive structure; and the first driving electrode is electrically connected to the first conductive structure via the first via-hole, the second driving electrode is electrically connected to the second conductive structure via the first conductive member and the second via-hole, and the second conductive member and the intermediate conductive layer are not directly connected electrically.

15. The electronic device substrate according to claim 14, wherein the orthographic projection of the second conductive member on the base substrate, an orthographic projection of the first conductive structure on the base substrate, and an orthographic projection of the second conductive structure on the base substrate are spaced apart.

16. The electronic device substrate according to claim 14, further comprising a second insulating layer and a driving back plate which are on a side of the intermediate conductive layer away from the first driving electrode;

the driving back plate comprises the base substrate;

the second insulating layer is between the intermediate conductive layer and the driving back plate;

the second insulating layer comprises a third via-hole and a fourth via-hole; and the first driving electrode is electrically connected to a first region of the driving back plate via the first via-hole, the first conductive structure, and the third via-hole, the second driving electrode is electrically connected to a second region of the driving back plate via the first conductive member, the second via-hole, the second conductive structure, and the fourth via-hole, and the second conductive member is not directly connected to the driving back plate electrically.

17. The electronic device substrate according to claim 16, wherein the second conductive member does not directly receive signals provided by the driving back plate.

18. The electronic device substrate according to claim 16, wherein the second conductive member is floating.

19. An electronic device, comprising an electronic device substrate, wherein the electronic device substrate comprises a base substrate, a first insulating layer, a plurality of light-emitting sub-units, a first conductive member, a second conductive member, and a third conductive member, the plurality of light-emitting sub-units are in an array region of the electronic device substrate, the first conductive member is in a periphery region, surrounding the array region, of the electronic device substrate, and the second conductive member is between the first conductive member and the array region;

each of the plurality of light-emitting sub-units comprises a first driving electrode and a second driving electrode, and the first driving electrode and the second driving electrode are configured to apply a light-emitting driving voltage;

the third conductive member is on the side of the first insulating layer away from the base substrate;

the third conductive member surrounds the array region, and the second conductive member surrounds the third conductive member;

each of the plurality of light-emitting sub-units comprises a light-emitting layer, and light-emitting layers of the plurality of light-emitting sub-units are integrated to form a light-emitting material layer; and the light-emitting material layer extends onto the third conductive member and at least partially overlaps with the third conductive member.

* * * * *